(12) United States Patent
Lim et al.

(10) Patent No.: US 11,636,895 B2
(45) Date of Patent: Apr. 25, 2023

(54) NON-VOLATILE RESISTIVE MEMORY DEVICE INCLUDING A PLURALITY OF WRITE MODES

(71) Applicant: SAMSUNG ELECTRONICS CO., LTD., Suwon-si (KR)

(72) Inventors: Cheaouk Lim, Hwaseong-si (KR); Jung Sunwoo, Seoul (KR); Kwangjin Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 276 days.

(21) Appl. No.: 16/870,506

(22) Filed: May 8, 2020

(65) Prior Publication Data
US 2021/0134365 A1  May 6, 2021

(30) Foreign Application Priority Data

Nov. 5, 2019  (KR) .................. 10-2019-0140134

(51) Int. Cl.
| | | |
|---|---|---|
| *G11C 13/00* | (2006.01) | |
| *H01L 45/00* | (2006.01) | |
| *H01L 27/24* | (2006.01) | |
| *H03K 19/20* | (2006.01) | |
| *H03K 19/21* | (2006.01) | |

(52) U.S. Cl.
CPC ........ *G11C 13/0069* (2013.01); *G11C 13/003* (2013.01); *G11C 13/0004* (2013.01); *G11C 13/004* (2013.01); *G11C 13/0026* (2013.01); *G11C 13/0028* (2013.01); *G11C 13/0097* (2013.01); *H01L 27/2481* (2013.01); *H01L 45/06* (2013.01); *H01L 45/1233* (2013.01); *G11C 2213/72* (2013.01); *G11C 2213/79* (2013.01); *H03K 19/20* (2013.01); *H03K 19/21* (2013.01)

(58) Field of Classification Search
None
See application file for complete search history.

(56) References Cited

U.S. PATENT DOCUMENTS

| | | | |
|---|---|---|---|
| 9,437,290 B2 | 9/2016 | Lee et al. | |
| 9,558,821 B2 | 1/2017 | Park et al. | |
| 9,947,404 B1 | 4/2018 | Park | |
| 2009/0141567 A1* | 6/2009 | Lee .................. | G11C 7/1096 |
| | | | 365/189.16 |
| 2009/0262569 A1* | 10/2009 | Shinozaki ........... | H01L 27/2436 |
| | | | 365/51 |

(Continued)

FOREIGN PATENT DOCUMENTS

| | | |
|---|---|---|
| JP | 2010-033620 A | 2/2010 |
| KR | 1020140088781 A | 7/2014 |
| KR | 10-1976045 B1 | 4/2019 |

*Primary Examiner* — J. H. Hur
(74) *Attorney, Agent, or Firm* — Volentine, Whitt & Francos, PLLC

(57) ABSTRACT

A writing method for a non-volatile memory device includes; performing a sensing operation, comparing write data with read data retrieved by the sensing operation, determining whether the write data is set state when the write data and the read data are the same, performing a set operation when the write data is set state, and not performing a write operation when the write data is not set data.

20 Claims, 31 Drawing Sheets

(56) References Cited

U.S. PATENT DOCUMENTS

| | | | |
|---|---|---|---|
| 2011/0134686 A1* | 6/2011 | Sohn | G11C 13/0004 |
| | | | 711/E12.007 |
| 2013/0033929 A1 | 2/2013 | Kim | |
| 2014/0369124 A1* | 12/2014 | Moon | G11C 16/16 |
| | | | 365/185.11 |
| 2016/0027508 A1 | 1/2016 | Lee et al. | |
| 2018/0061466 A1 | 3/2018 | Park et al. | |

* cited by examiner

FIA. 2B

| Previous Data | Read Data | Write Data | Operation | Comment |
|---|---|---|---|---|
| 1 | 1 (A) | 1 | X | |
| | | 0 | RST | |
| 0 | 0 (B) | 1 | SET | Fail Data |
| | | 0 | X | Metastate Data |
| | 0 | 1 | SET | |
| | | 0 | X | |

FIG. 13

| Read Data | Write Data | DCW | aDCW |
|---|---|---|---|
| 1 | 1 | X | O |
| 1 | 0 | O | O |
| 0 | 1 | O | O |
| 0 | 0 | X | X |

FIG. 14

| Previous Data | Read Data | Write Data | Operation | Comment |
|---|---|---|---|---|
| 1 | 1 | 1 | SET | |
| | | 0 | RST | |
| 0 | 1 | 1 | SET | METASTATE DATA IN EXISTING DCW |
| | | 0 | RST | Lucky Pass |
| | 0 | 1 | SET | |
| | | 0 | X | |

FIG. 15

| WR data | Old data | DCW | aDCW | RDSKIP aDCW Read | RDSKIP aDCW Write |
|---|---|---|---|---|---|
| 0 | 0 | X | X | O | X |
| 0 | 1 | O | O | O | O |
| 1 | 0 | O | O | X | O |
| 1 | 1 | X | O | X | O |

FIG. 16

NON-VOLATILE RESISTIVE MEMORY DEVICE INCLUDING A PLURALITY OF WRITE MODES

CROSS-REFERENCE TO RELATED APPLICATION(S)

This application claims priority to Korean Patent Application No. 10-2019-0140134 filed on Nov. 5, 2019 in the Korean Intellectual Property Office, the subject matter of which is hereby incorporated by reference.

BACKGROUND

Example embodiments of the inventive concept relate to non-volatile memory devices, writing methods for writing data to a non-volatile memory, and storage devices including non-volatile memory devices.

A data comparison write (DCW) method has been used to reduce power consumption and improve write operations performed by phase change memory (PCM) devices. The DCW method includes reading a stored value from a PCM cell during a write operation, and when an input value is different from the stored value, writing the input value to the PCM cell. Thus, when the stored value of the PCM cell is not different from the input value, power otherwise used to perform a write operation may be conserved. In the DCW method, a read operation may be performed before a write operation in order to determine the stored value of the PCM cell. However, when an input value is known to the same as a stored value, the read operation may not be performed.

SUMMARY

Certain example embodiments of the inventive concept provide non-volatile memory devices exhibiting reduce power consumption and improved reliability. Other example embodiments of the inventive concept provide writing methods for such non-volatile memory devices and storage devices including same.

According to an example embodiment of the inventive concept, a non-volatile memory (NVM) device includes; a memory cell array including a plurality of resistive memory cells connected to a plurality of bit lines and a plurality of word lines, a word line driver configured to select one of the plurality of word lines in response to an address, and apply a word line voltage to the selected word line, a bit line driver configured to select one of the plurality of bit lines in response to the address, and apply a bit line voltage to the selected bit line, a write circuit configured to generate the bit line voltage and the word line voltage in response to a write control signal, a read circuit configured to read data from a resistive memory cell connected to the selected word line and the selected bit line in response to a read control signal, an input and output (I/O) circuit configured to receive write data from an external device, and control logic configured to select a write mode from a plurality of write modes, generate the write control signal based on at least one of the selected write mode, the write data, and the read data, and generate the read control signal based on at least one of the selected write mode and the write data.

According to an example embodiment of the inventive concept, a writing method for a non-volatile memory (NVM) device includes; performing a sensing operation, comparing write data with read data retrieved by the sensing operation, determining whether the write data is set state when the write data and the read data are the same, performing a set operation when the write data is set data, and not performing a write operation when the write data is not set data.

According to an example embodiment of the inventive concept, a writing method for a non-volatile memory (NVM) device includes; receiving write data, determining whether the write data corresponds to a set state, performing a set operation when the write data corresponds to the set state, performing a sensing operation when the write data does not correspond to a set state, and not performing a write operation when read data retrieved by the sensing operation corresponds to a reset state, and performing a reset operation when the read data does not correspond to the reset state.

BRIEF DESCRIPTION OF DRAWINGS

The above and other aspects, features, and advantages of the inventive concept may be more clearly understood upon consideration of the following detailed description together with the accompanying drawings, in which:

FIGS. 2A, 2B, 2C, and 2D are diagrams illustrating an example of a memory cell according to an example embodiment of the inventive concept;

FIG. 13 is diagram illustrating an example of a data table corresponding to a write operation performed in a DCW mode;

FIG. 14 is a diagram illustrating an example of a data table corresponding to a write operation mode according to an example embodiment of the inventive concept;

FIG. 15 is a diagram illustrating an example of a data table relating to a write operation performed in an aDCW mode according to an example embodiment of the inventive concept;

FIG. 16 is a diagram illustrating an example of a data table relating to a write operation mode according to another example embodiment of the inventive concept;

DETAILED DESCRIPTION

Hereinafter, embodiments of the inventive concept will be described as follows with reference to the accompanying drawings.

A writing method used in conjunction with the a non-volatile memory (NVM) device in certain example embodiments of the inventive concept may include: (1) performing a read (or sensing) operation using a second read level that is greater than or equal to a first read level, (2) comparing a "stored value" resulting from the read operation with an "input value" for data to be written to the NVM device to generate a comparison result, and (3) determining whether to perform a write operation based on (or in response to) the comparison result. For example, when a comparison of a stored value and an input value generates (or corresponds to) a reset state, the write operation may not be performed. Accordingly, a NVM device using the foregoing writing method may prevent the occurrence of a write operation failure caused (e.g.,) by a resistance drift phenomenon.

Figure 1:
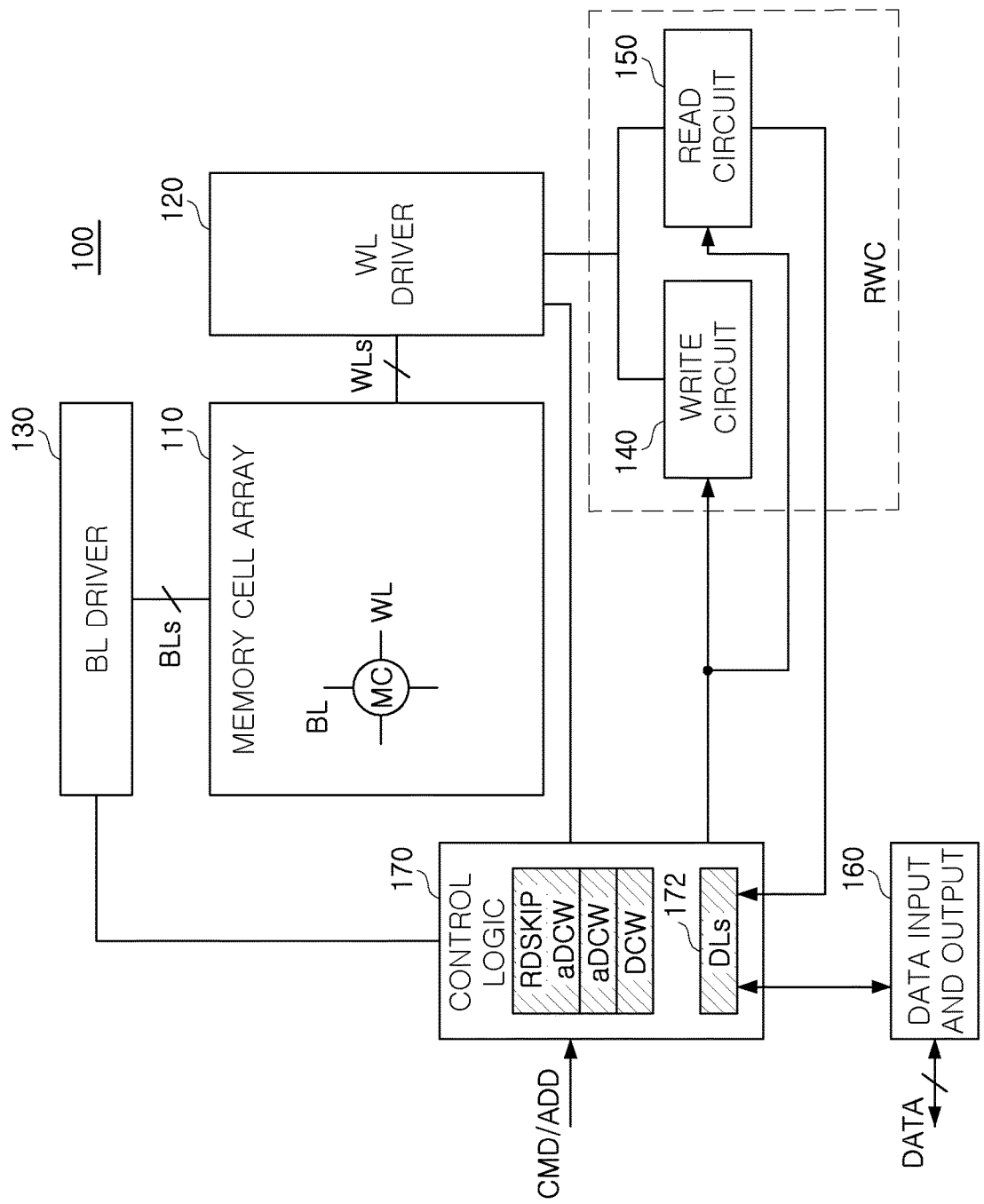
FIG. 1 is a diagram illustrating an example of a non-volatile memory device 100 according to an example embodiment of the inventive concept.

FIG. (FIG.) 1 is a diagram illustrating a non-volatile memory (NVM) device 100 according to an example embodiment. Referring to FIG. 1, the NVM device 100 may include a memory cell array 110, a word line driver 120, a bit line driver 130, a write circuit 140, a read circuit 150, a data input and output (I/O) circuit 160, and control logic 170.

The memory cell array 110 may be connected to the word line driver 120 through a plurality of word lines WLs, and may be further connected to the bit line driver 130 through a plurality of bit lines BLs. The memory cell array 110 may include a plurality of memory cells connected to the plurality of word lines WLs and the plurality of bit lines BLs. As illustrated in FIG. 1, a memory cell MC may be connected between a word line WL and a bit line BL. The memory cell MC may be used to store one or more bit(s) using a resistive material. FIG. 1 illustrates a single memory cell array, but an example embodiment is not limited thereto. The NVM device 100 may have a structure in which the plurality of memory cell arrays are stacked in a direction perpendicular to a substrate (e.g., a vertical direction).

The word line driver 120 may be connected to the memory cell array 110 through the word lines WLs. The word line driver 120 may select one of the word lines WLs using a row address provided under the control of the control logic 170. Also, the word line driver 120 may apply a word line voltage to the selected word line. The word line voltage may include a read word line voltage, a write word line voltage, and the like.

The bit line driver 130 may be connected to the memory cell array 110 through the bit lines BLs. The bit line driver 130 may select one of the bit lines BLs using a column address according to control of the control logic 170. Also, the bit line driver 130 may apply a bit line voltage to the selected bit line. The bit line voltage may include a read voltage, a set bit line voltage, a reset bit line voltage, and the like.

The write circuit 140 may be connected to the word line driver 120 and the bit line driver 130. The write circuit 140 may be configured to write data to (e.g., a set operation or a reset operation) memory cells connected to the selected bit line and the selected word line under the control of the control logic 170. For example, the write circuit 140 may apply a word line voltage to the selected word line and may apply a bit line voltage to the selected bit line in response to a write control signal of the control logic 170. In an example embodiment, the write circuit 140 may generate a set pulse or a reset pulse corresponding to the data to the written during the write operation, and may apply a set pulse or a reset pulse to the selected word line/bit line.

The read circuit 150 may be configured to read data from the memory cells connected to the selected word line and the selected bit line under the control of the control logic 170. For example, the read circuit 150 may read data from the memory cell connected to the selected word line and the selected bit line in response to a read control signal of the control logic 170. In an example embodiment, the read circuit 150 may perform a sensing operation for sensing a voltage difference between a voltage of the selected word line/bit line and a reference voltage and distinguishing on/off cells from each other according to the sensed voltage difference.

Collectively or singularly, the write circuit 140 and/or the read circuit 150 may be referred to as a read write circuit (RWC). The RWC may be disposed below the word line driver 120 as illustrated in FIG. 1.

The data I/O circuit 160 may be configured to transfer write data received from an external device (e.g., a memory controller) to data latches 172 during a write operation under the control of the control logic 170. The data I/O circuit 160 may also be configured to transfer read data retrieved from the data latches 172 during a read operation to an external device (e.g., a memory controller).

The control logic 170 may be configured to control overall operations of the NVM device 100. Thus, the control logic 170 may be used to control the word line driver 120, the bit line selecting circuit 130, the write circuit 140, the read circuit 150, and/or the data I/O circuit 160 in response to one or more command(s) CMD, address(es) ADD, data and/or control signals.

The control logic 170 may be used to select a write mode from a plurality of possible write modes, and may then control the execution (or performance) of a write operation according to the selected write mode. In an example embodiment, the control logic 170 may be used to generate a write control signal in response to at least one of the selected write mode, write data, and/or read data. The control logic 170 may also be used to generate a read control signal in response to at least one of the selected write mode, write data and/or the read data.

In an example embodiment, a particular write mode selected from the plurality of write modes may be used to define the execution (or performance) of a write operation. The plurality of write modes may include: a normal mode, a data comparison write (DCW) mode, an aggressive data comparison write (aDCW) mode, and/or a read skip aggressive data comparison write mode (RDSKIP aDCW) mode. Here, the normal mode is a write mode in which a resistance drift is not reflected, the DCW mode is a write mode in which a resistance drift for a reset state is reflected, and the aDCW mode and the RDSKIP aDCW mode are write modes in which both resistance drifts in a set state and a reset state are reflected.

For a write operation performed in the normal mode, the control logic 170 may control the write circuit 140 to perform a set operation and/or a reset operation according to the input (or write) data to be written to a memory cell.

For a write operation performed in the DCW mode, the control logic 170 may control the write circuit 140 and the read circuit 150 to compare stored data (i.e., "read data") retrieved from a memory cell using the sensing operation with the write data to be written, and then perform a set operation or a reset operation according to the resulting comparison result.

For a write operation performed in the aDCW mode, the control logic 170 may control the write circuit 140 and the read circuit 150 to compare read data from a memory cell using the sensing operation with write data to be written, and then perform a set operation or a reset operation using the resulting comparison result and the write data to be written. For a write operation performed in the aDCW mode, when both the read data and write data correspond to reset data, the write operation may not be performed.

For a write operation performed in the RDSKIP aDCW mode, the control logic 170 may perform a set operation rather than performing a sensing operation when the write data is set data. However, when the write data is not set data, the control logic 170 may perform a sensing operation, compare read data retrieved from a memory cell using the sensing operation with the write data, and determine whether to perform a reset operation or to not perform a write operation using the comparison result.

Here, it should be generally noted that NVM devices tend to expand the distribution of resistance value(s) over time by drifting the resistance value of a memory cell. This phenomenon may cause reliability issues in relation to data stored in the constituent memory cells of the NVM device. In contrast with this general outcome, the NVM device 100 of FIG. 1 may accurately reflect in its operation a resistance drift when performing write operations according to one of the DCW mode/aDCW mode/RDSKIP aDCW mode, thereby improving data reliability.

In certain embodiments of the inventive concept, the memory cell MC illustrated in FIG. 1 may include a variable resistance.

FIGS. 2A, 2B, 2C, and 2D are respective diagrams illustrating examples of a memory cell that may be used in example embodiments.

Figure 2A:
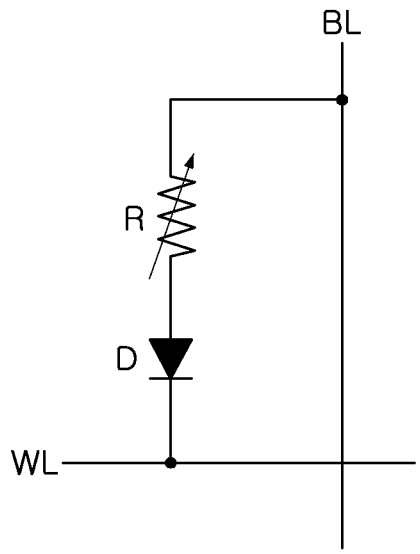

Referring to FIG. 2A, a memory cell MC may include a variable resistance R and a diode D. In an example embodiment, the variable resistance R may be a phase change material. For example, the phase change material may be implemented as various types of materials such as GaSb, InSb, InSe. Sb2Te3, GeTe, formed by combining two elements, GeSbTe, GaSeTe, InSbTe, SnSb2Te4, InSbGe, formed by combining three elements, AgInSbTe, (GeSn) SbTe, GeSb(SeTe), Te81Ge15Sb2S2, formed by combining four elements, or the like. In another example embodiment, the variable resistance R may include perovskite compounds, transition metal oxide, magnetic materials, ferromagnetic material, antiferromagnetic materials, or the like, instead of a phase change material.

Referring to FIG. 2B, the memory cell MC may include a variable resistance R and a bidirectional diode BD.

Figure 2C:
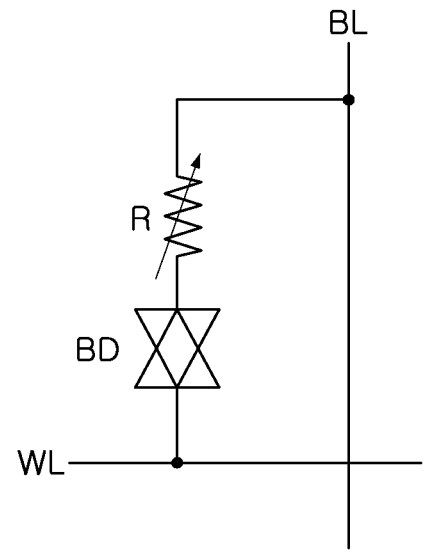
Figure 2C:
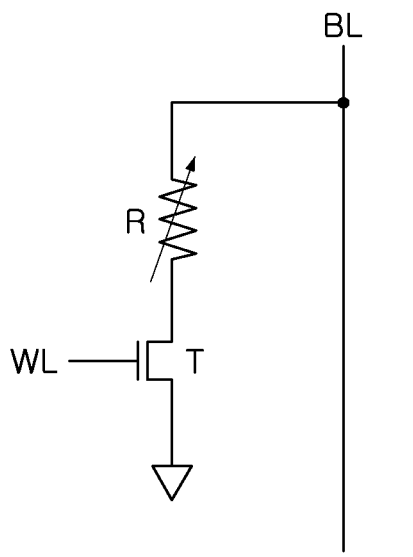

Referring to FIG. 2C, the memory cell MC may include a variable resistance R and a transistor T. A word line WL may be connected to a gate of the transistor T.

Figure 2D:
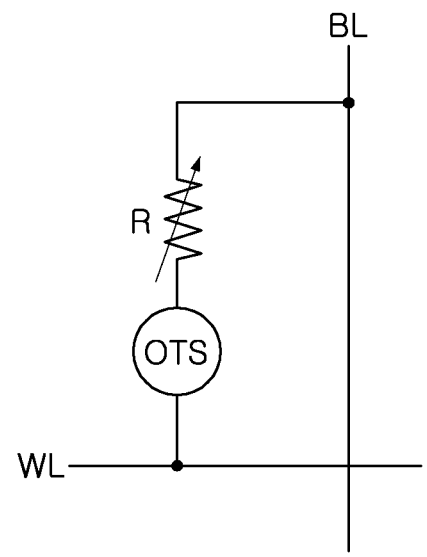

Referring to FIG. 2D, the memory cell MC may include an ovonic threshold switch OTS and a variable resistance R. The ovonic threshold switch OTS may include a material similar to germanium-antimony-telluride (GST; Ge2Sb2Te5). For example, the ovonic threshold switch OTS may be a combination of selenium (Se), arsenic (As), germanium (Ge), and silicon (Si), and may include chalcogenide which may change a crystalline state and an amorphous state.

The structure of a memory cell MC in the example embodiments is not limited to only the examples illustrated in FIGS. 2A, 2B, 2C, and 2D.

In the description below, certain three-dimensional memory cell structures configured as a switching device will be described according to example embodiments.

FIGS. 3A, 3B, 3C, 3D, 3E, and 3F are respective diagrams illustrating examples of a three-dimensional memory cell structure that may be used in example embodiments.

Figure 3A:
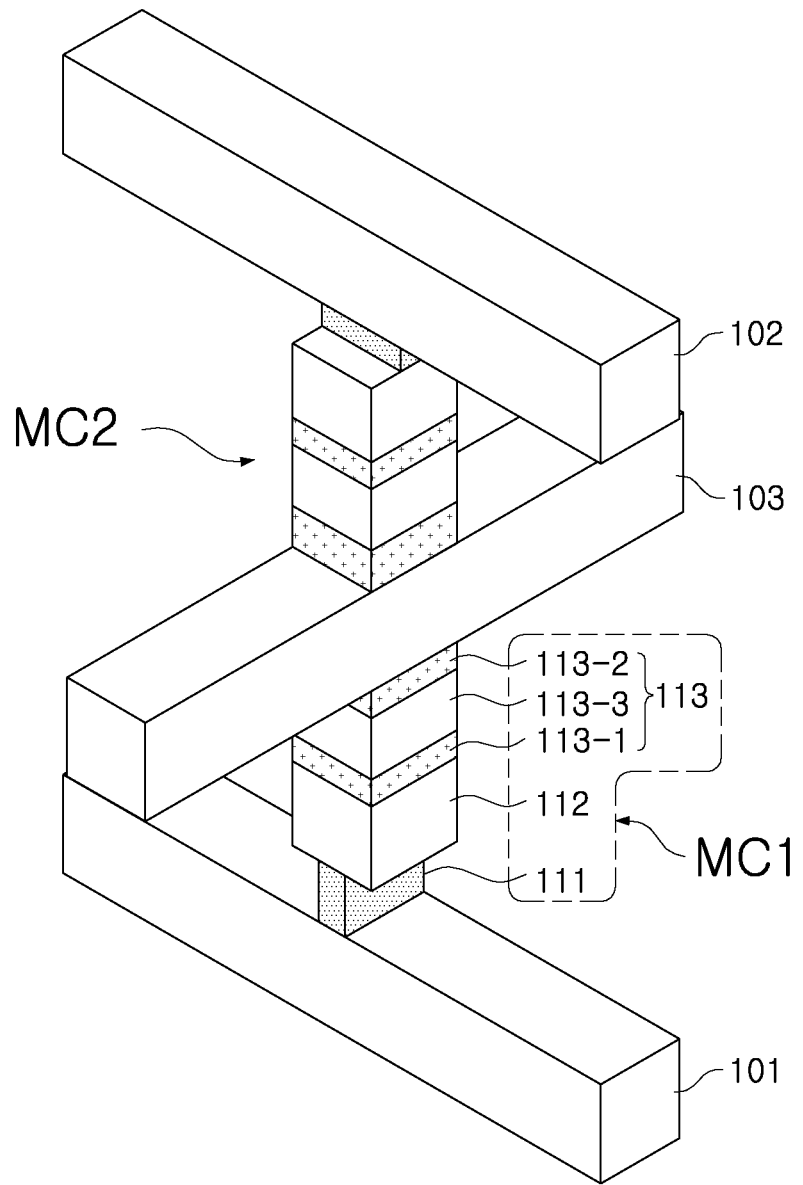
FIGS. 3A, 3B, 3C, 3D, 3E, and 3F are diagrams illustrating an example of a three-dimensional structure of a memory cell.

FIG. 3A illustrates a first memory cell MC1 and a second memory cell MC2 arranged among a plurality of conductive lines 101, 102, and 103. The first memory cell MC1 and the second memory cell MC2 may operate as independent memory cells. In an example embodiment, when the first conductive line 101 and the second conductive line 102 are word lines, the third conductive line 103 may be a bit line. When the first conductive line 101 and the second conductive line 102 are bit lines, the third conductive line 103 may be a word line. In the description that follows, the first conductive line 101 and the second conductive line 102 may be referred to as a first word line and a second word line, respectively, for ease of description.

In the example embodiment, the first memory cell MC1 may include a first heating electrode 111, a first information storage device 112, and a first switch device 113. In the example embodiment, the first switch device 113 may include a first switch electrode 113-1, a second switch electrode 113-2, and a first selection layer 113-3 disposed between the first switch electrode 113-1 and the second switch electrode 113-2. In the example embodiment, the first selection layer 113-3 may include an ovonic threshold switch OTS material. When a voltage level greater than a threshold voltage is applied between the first switch electrode 113-1 and the second switch electrode 113-2, a current may flow through the first selection layer 113-3. The first information storage device 112 may include a phase change material. In the example embodiment, the first information storage device 112 may include a chalcogenide material as an example. For example, the first information storage device 112 may include Ge-Sb-Te(GST). A crystallization temperature, a melting point, a speed of phase change depending on crystallization energy, and the like, of the first information storage device 112 may be determined according to types of elements included in the first information storage device 112 and a chemical composition ratio thereof.

The second memory cell MC2 may have a structure similar to the structure of the first memory cell MC1.

In the description that follows, a method for writing and erasing data will be described with reference to the first memory cell MC1. When a voltage is applied through the first word line 101 and the bit line 103, a joule heat, generated according to a voltage, may be generated on an interfacial surface between the first heating electrode 111 and the first information storage device 112. By the joule heat, a phase change material included in the first information storage device 112 may change from a non-crystalline state to a crystalline state, or may change from a crystalline state to a non-crystalline state. The first information storage device 112 may have relatively high resistance in an amorphous state, and may have relatively low resistance in a crystalline state. In an example embodiment, data "0" or "1" may be defined according to a resistance value of the first information storage device 112.

To write data in the first memory cell MC1, a program voltage may be applied through the first word line 101 and the bit line 103. The program voltage may be greater than a threshold voltage of an ovonic threshold switch material included in the first switch device 113. Accordingly, a current may flow through the first switch device 113. By the program voltage, a phase change material included in the first information storage device 112 may change from a non-crystalline state to a crystalline state. Accordingly, data may be stored in a first memory area. In an example embodiment, when a phase change material included in the first information storage device 112 has a crystalline state, a state of the first memory cell MC1 may be defined as a set state.

To erase data stored in the first memory cell MC1, the phase change material included in the first information storage device 112 may restore to a non-crystalline state from a crystalline state. For example, a predetermined erase voltage may be applied through the first word line 101 and the bit line 103. By the erase voltage, the phase change material included in the first information storage device 112 may restore to a crystalline state from a non-crystalline state. When the phase change material included in the first information storage device 112 has a non-crystalline state, a state of the first memory cell MC1 may be defined as a reset state. In an example embodiment, a maximum value of the erase voltage may be greater than a maximum value of the program voltage. The time during which the erase voltage is applied may be shorter than the time during which the program voltage is applied.

FIG. 3A illustrates the example in which the first memory cell MC1 and the second memory cell MC2 may have the same directivity. However, example embodiments of the inventive concept are not limited thereto.

Figure 3B:
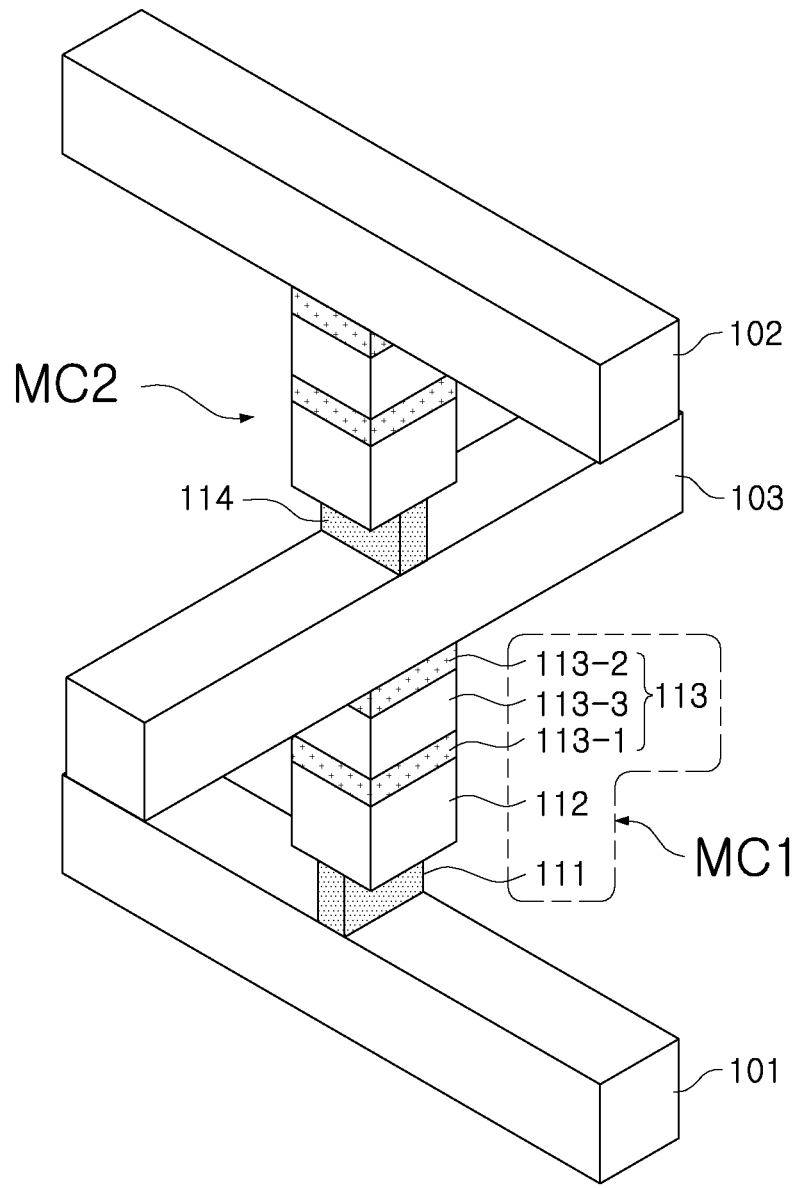

Referring to FIG. 3B, when the first conductive line 101 and the second conductive line 102 are a first word line and a second word line, respectively, different from the memory cell illustrated in FIG. 3A, directivities of the first memory cell MC1 and the second memory cell MC2 may be different. For example, the heating electrode 111 of the first memory cell MC1 may be connected to the first word line 101, and a heating electrode 114 of the second memory cell MC2 may be connected to the bit line 103.

The first memory cell MC1 and the second memory cell MC2 illustrated in FIG. 3A may be said to have first directivity. The first memory cell MC1 illustrated in FIG. 3B may be said to have second directivity, and the second memory cell MC2 may have first directivity.

In FIGS. 3A and 3B, the first memory cell MC1 connected to the first word line disposed on a first layer and the second memory cell MC2 connected to the second word line disposed on a second layer may share a bit line. However, example embodiments of the inventive concept are not limited thereto.

Referring to FIG. 3B, the first memory cell MC1 may be arranged at a point at which the first word line 101 disposed on the first layer and the first bit line 102 disposed on the first layer intersect. The second memory cell MC2 may be arranged at a point at which the second word line 103 disposed on the second layer and the second bit line 104 disposed on the second layer intersect. The first memory cell MC1 may have second directivity, and the second memory cell MC2 may have first directivity. Referring to FIG. 3D, each of the first memory cell MC1 and the second memory cell MC2 may have second directivity, different from the memory cells illustrated in FIG. 3C.

The memory cells of certain example embodiments may not have a heating electrode, but instead may be self-heated.

Figure 3C:
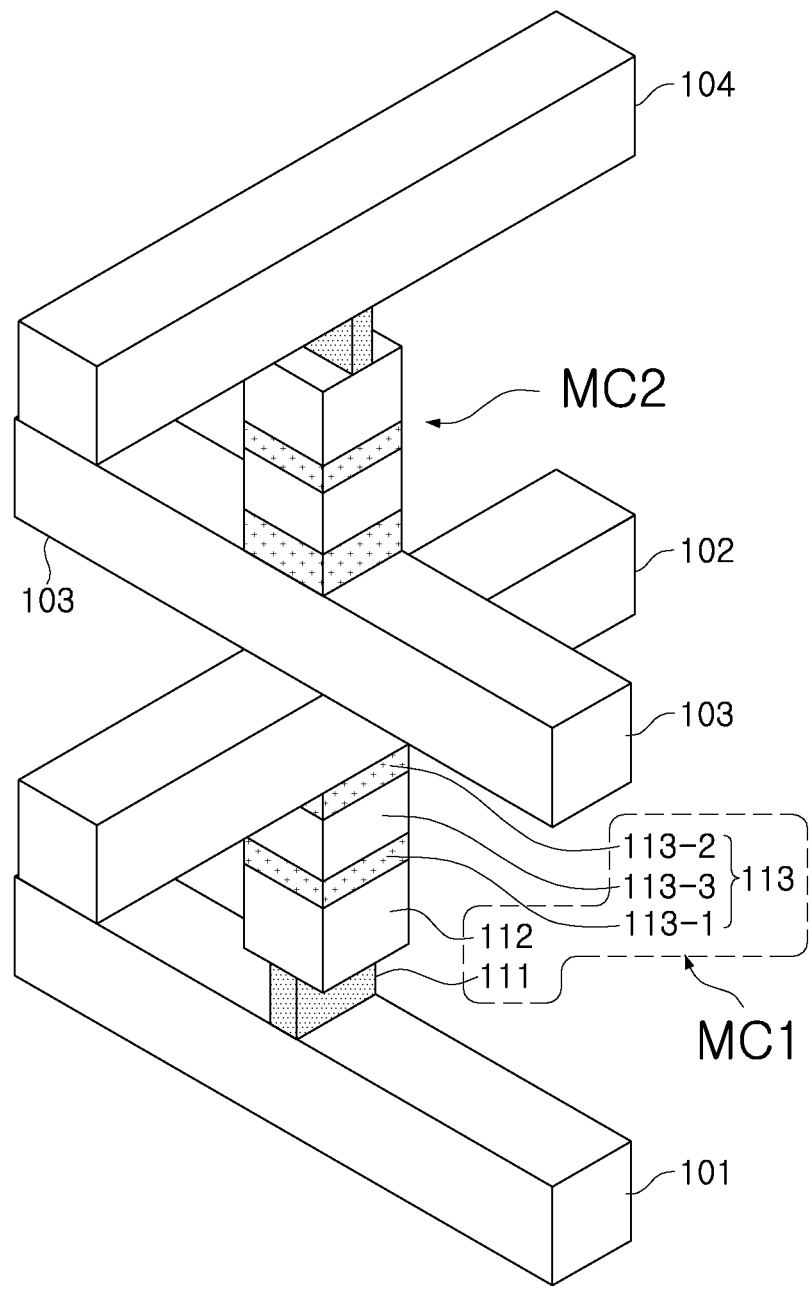
Figure 3D:
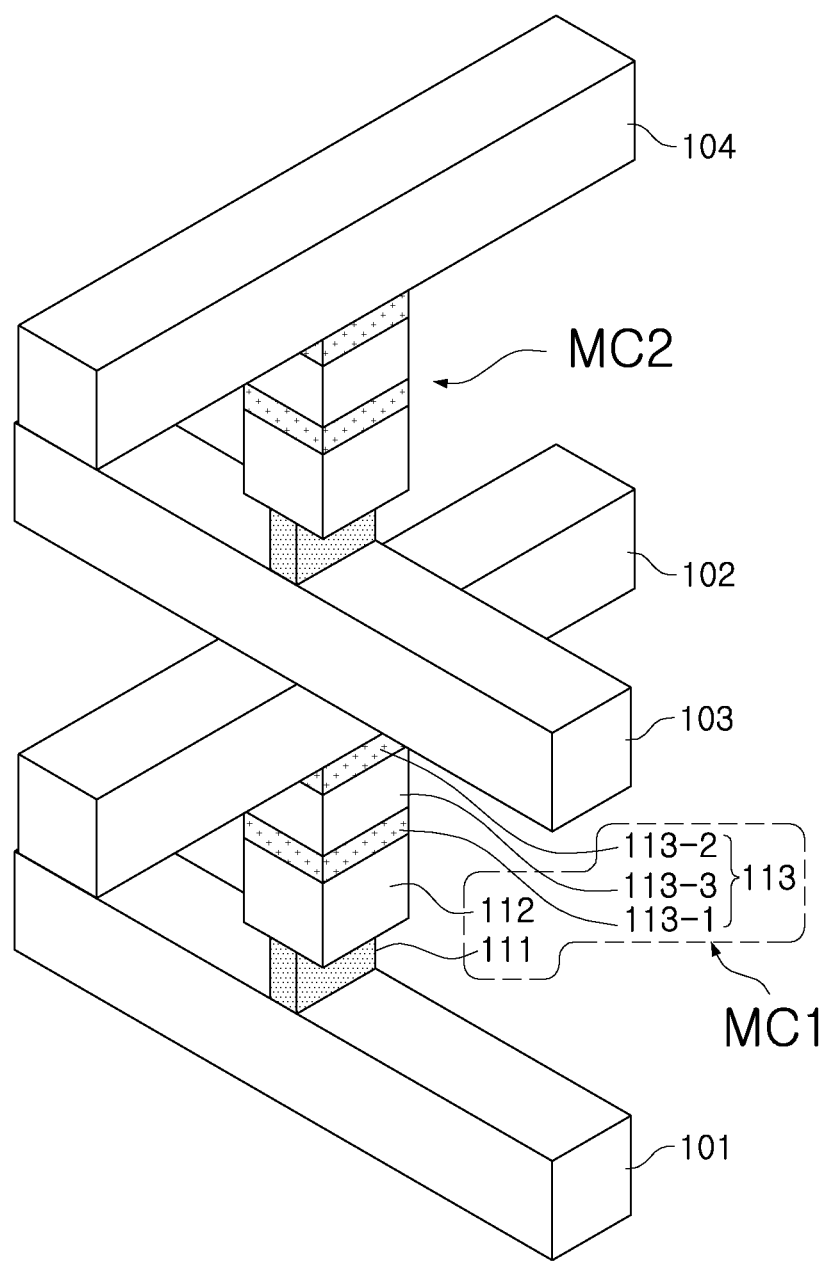
Figure 3E:
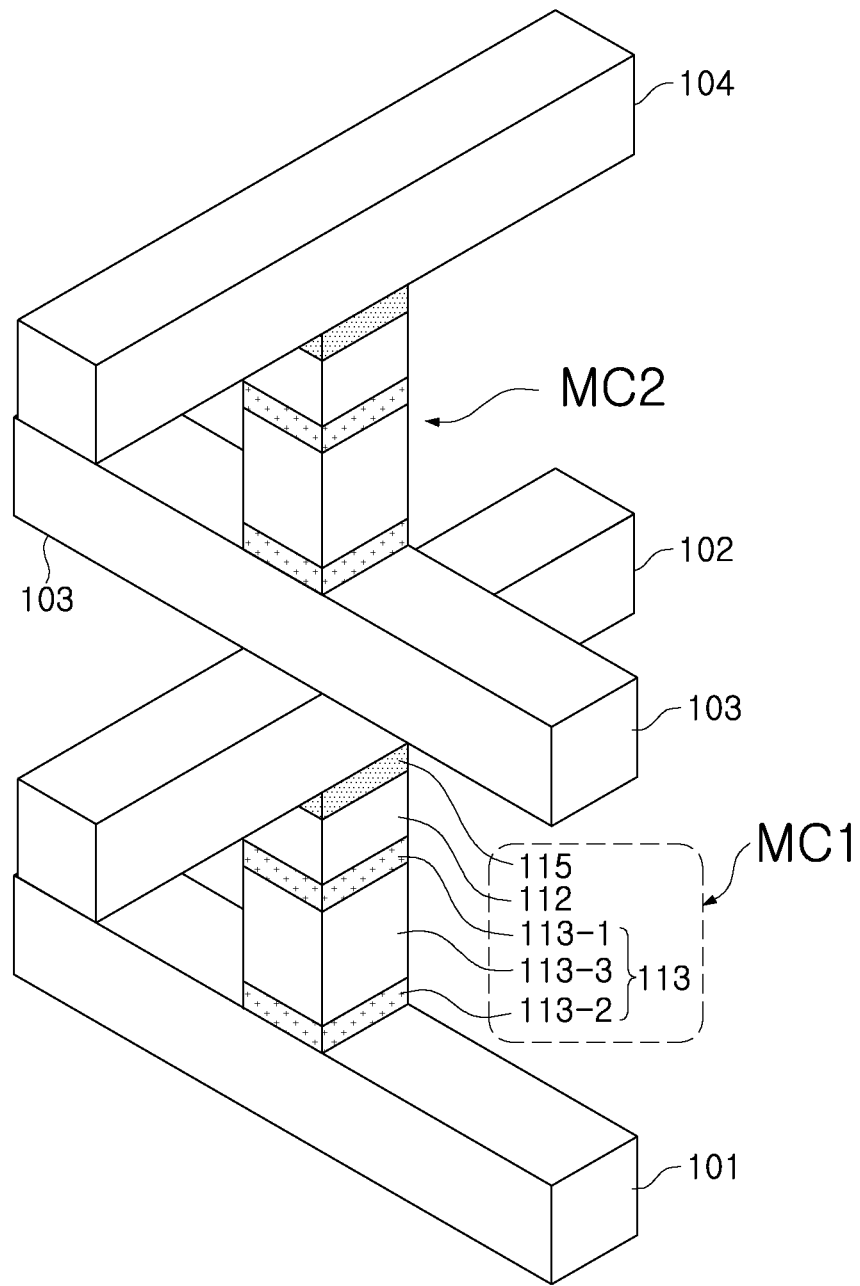
Figure 3F:
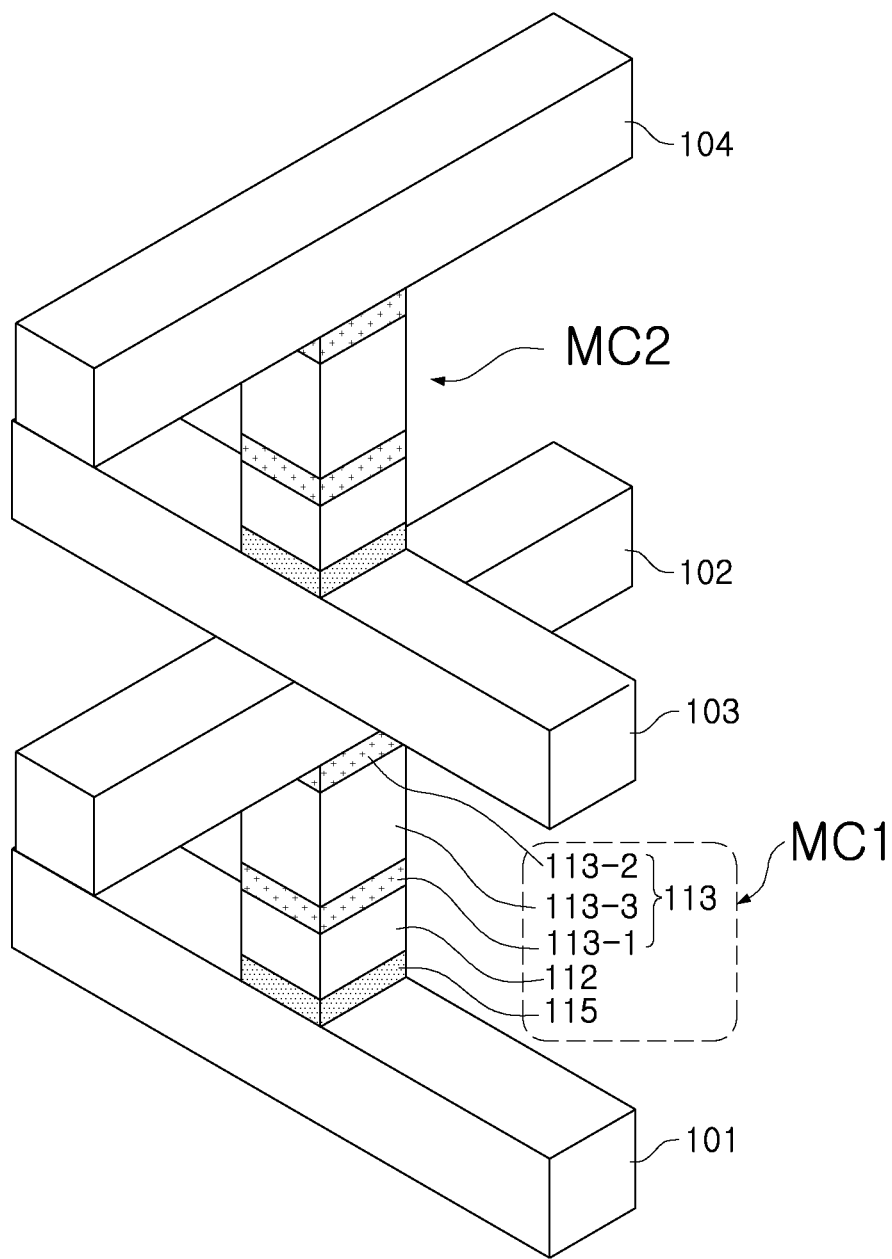

FIG. 3E further illustrates a memory cell like the one illustrated in FIG. 3C with the heating electrode removed, and FIG. 3F illustrates a memory cell like the one illustrated in FIG. 3D with the heating electrode removed.

The memory cell array 110 may have a three-dimensional stack structure.

Figure 4:
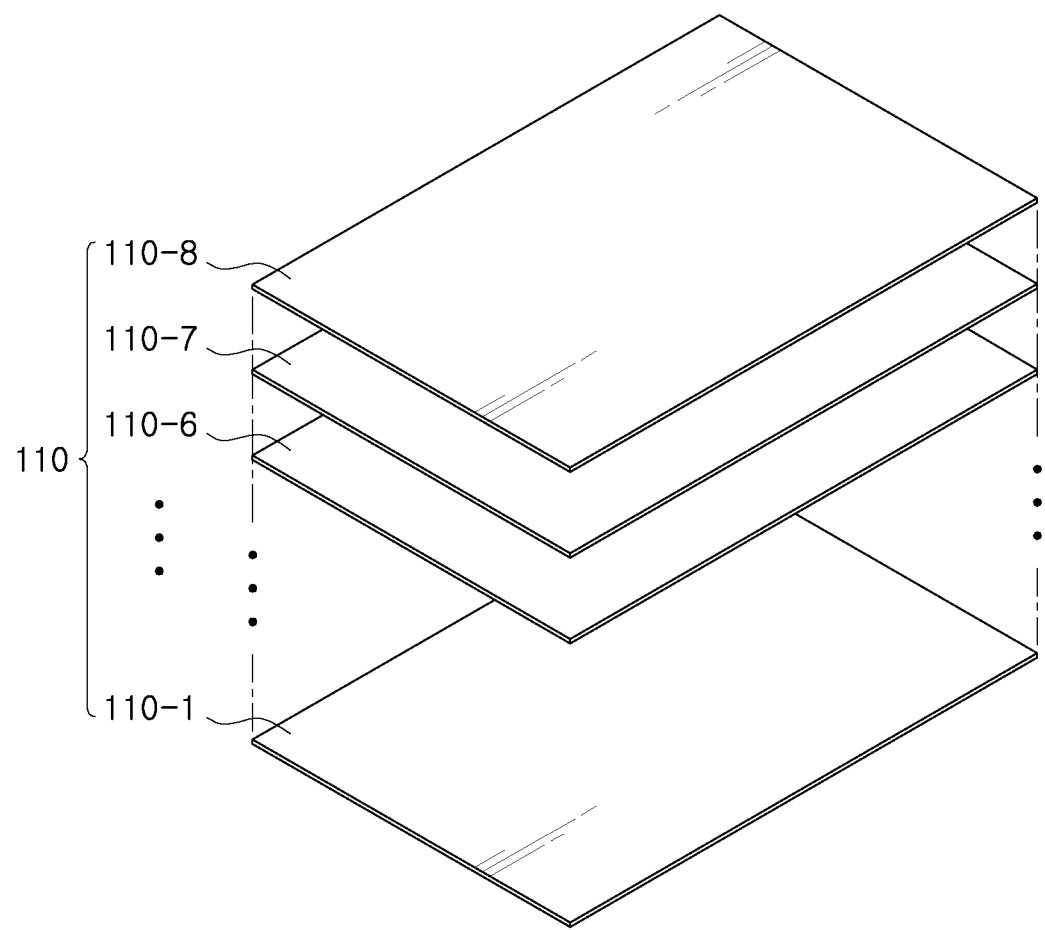
FIG. 4 is a diagram illustrating an example of a three-dimensional stack structure of a memory cell array 110 according to an example embodiment of the inventive concept.

FIG. 4 is a diagram illustrating an example of a three-dimensional stack structure for the memory cell array 110 of FIG. 1 according to an example embodiment. The three-dimensional stack structure may include a structure in which a plurality of memory cell layers (e.g.,) 110-1 to 110-8 are vertically stacked (e.g., stacked on top of one another perpendicularly with reference to a substrate).

The illustrated example of FIG. 4 shows eight (8), stacked memory cell layers 110-1 to 110-8, but any reasonable number of the layers might be used. Each of the memory cell layers 110-1 to 110-8 may include a plurality of resistive memory cell groups and/or a plurality of redundancy memory cell groups. When the memory cell array 110 has a three-dimensional stack structure, as in the illustrated example embodiment of FIG. 4, the memory cell layers 110-1 to 110-8 may have a cross point structure.

In the example embodiment, at least two of the memory cell layers 110-1 to 110-8 may perform respective write operations according to different write modes.

Figure 5:
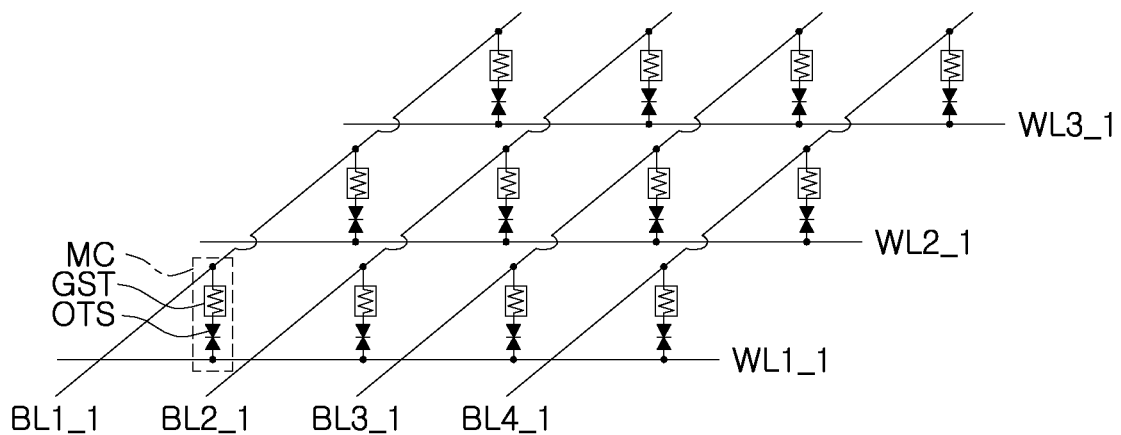
FIG. 5 is a diagram illustrating an example of a single memory cell array 110-1 illustrated in FIG. 4.

FIG. 5 is a diagram further illustrating an example of the single memory cell array 110-1 of FIG. 4. Here, the memory cell array 110-1 may include a cross point structure. The cross point structure may refer to a structure in which a single resistive memory cell MC is disposed in an area in which one line and another line intersect. For example, bit lines BL1_1 to BL4_1 may extend in a first direction, word lines WL1_1 to WL3_1 may extend in a second direction to intersect with the bit lines BL1_1 to BL4_1, and the resistive memory cell MC may be disposed in areas at which the bit lines BL1_1 to BL4_1 and the word lines WL1_1 to WL3_1 intersect, respectively.

In an example embodiment, the memory cell MC may be configured as a single level cell (SLC) storing a single data bit. In another example embodiment, the memory cell MC may be configured as a multilevel cell (MLC) which may storing two or more data bits. In another example embodiment, memory cells in one portion of the memory cell array 110 may be configured as SLC, and memory cells in another portion of the memory cell array 110 may be configured as MLC.

The memory cell array 110 in certain example embodiments may further include a memory cell array portion that performs a buffer function.

Figure 6:
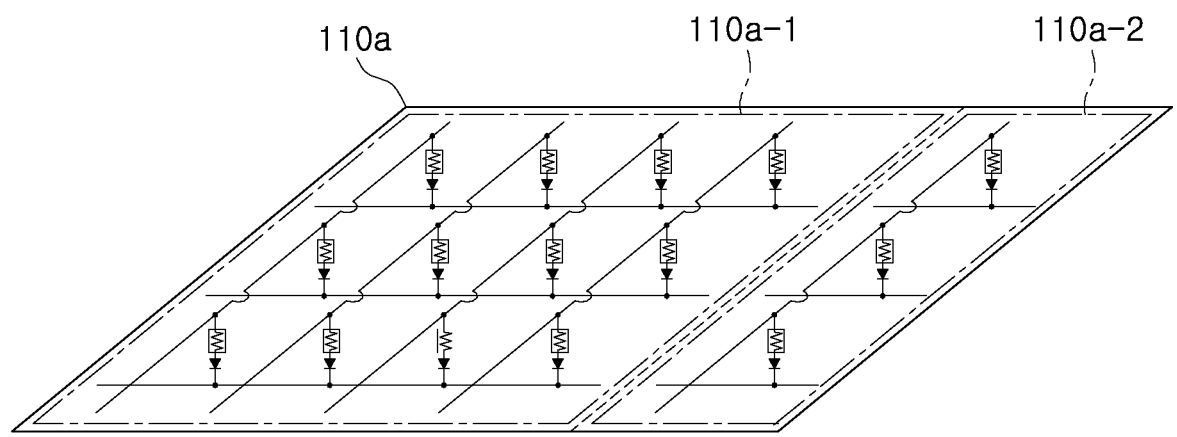
FIG. 6 is a diagram illustrating an example of a memory cell array 110a according to another example embodiment of the inventive concept.
Figure 6:
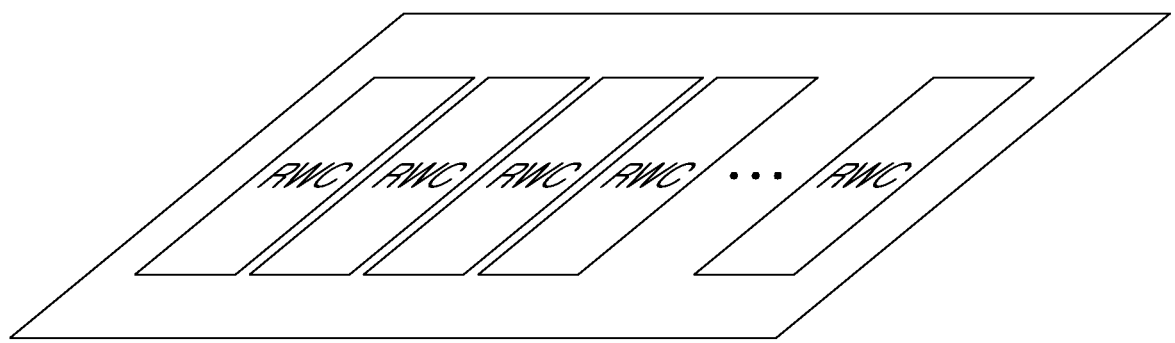

FIG. 6 is a diagram illustrating an example of a memory cell array 110a according to another example embodiment. Referring to FIG. 6, the memory cell array 110a may include a first memory cell array 110a-1 and a second memory cell array 110a-2. Here, the first memory cell array 110a-1 may operate as a main memory cell array, and the second memory cell array 110a-2 may operate as a buffer.

In an example embodiment, the first memory cell array 110a-1 and the second memory cell array 110a-2 may perform respective write operations according to different write modes.

Also, as illustrated in FIG. 6, a RWC layer may be disposed below the memory cell array 110a. The RWC layer (including e.g., the write circuit 140 and/or the read circuit 150 of FIG. 1) may be used to perform a write operation and/or a read operation in relation to a plurality of memory cells included in the memory cell array 110a. The RWC layer illustrated in FIG. 6 may be disposed below the memory cell array 100a, but a position of the RWC layer is not limited thereto.

A first memory cell array 111a and a second memory cell array 111b of FIG. 6 may be disposed on the same layer. However, example embodiments of the inventive concept are not limited thereto, and the first memory cell array and the second memory cell array may be disposed on different layers.

Figure 7:
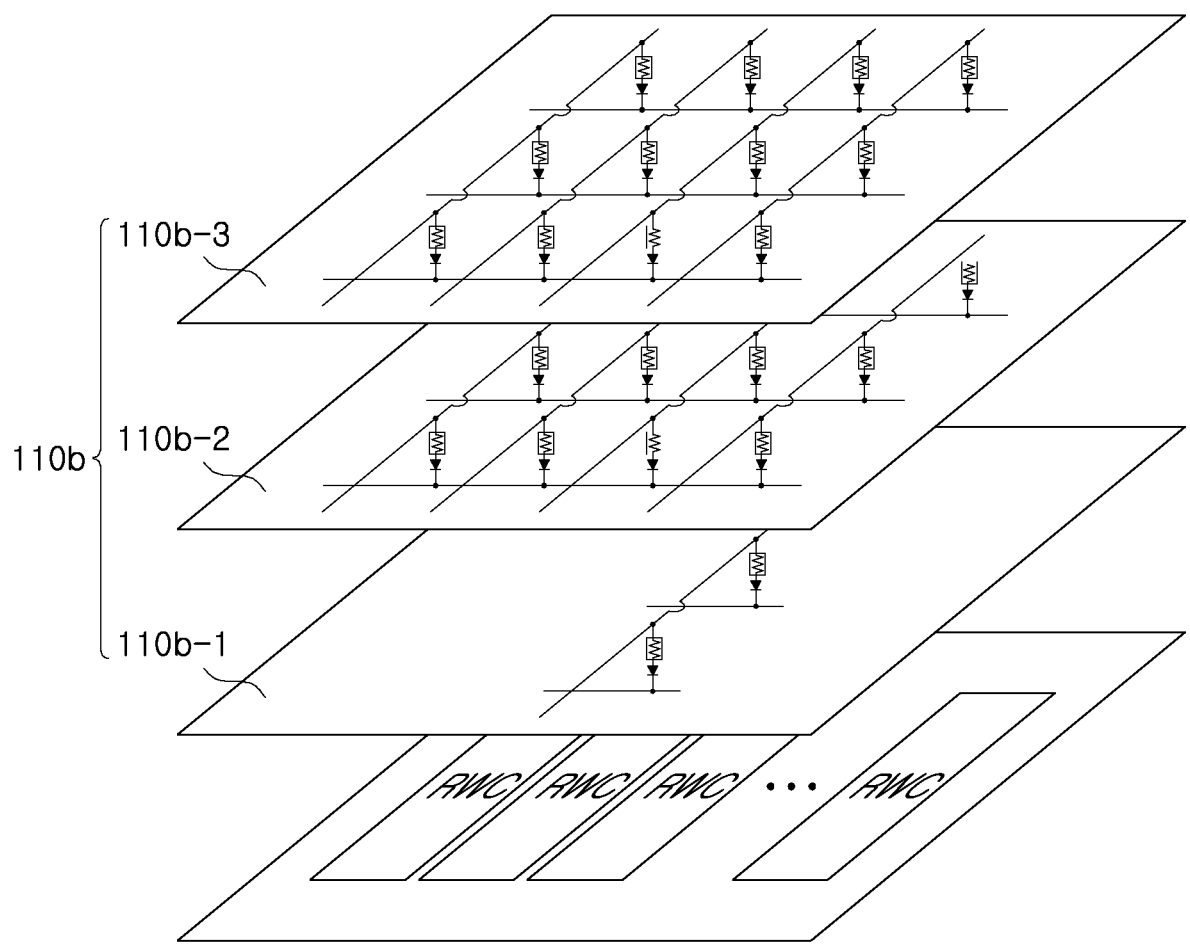
FIG. 7 is a diagram illustrating an example of a memory cell array 110b according to another example embodiment of the inventive concept.

FIG. 7 is a diagram illustrating an example of a memory cell array 110b according to another example embodiment. Referring to FIG. 7, the memory cell array 110b may include a plurality of first memory cell arrays 110b-1 and 110b-2 disposed at different layers and a second memory cell array 110b-3 disposed at a level different from either of the levels at which the first memory cell arrays 110b-1 and 110b-2 are disposed.

In an example embodiment, at least two of the first memory cell arrays 110b-1 and 110b-2 and the second memory cell array 110b-3 may perform respective write operation according to different write modes.

Figure 8:
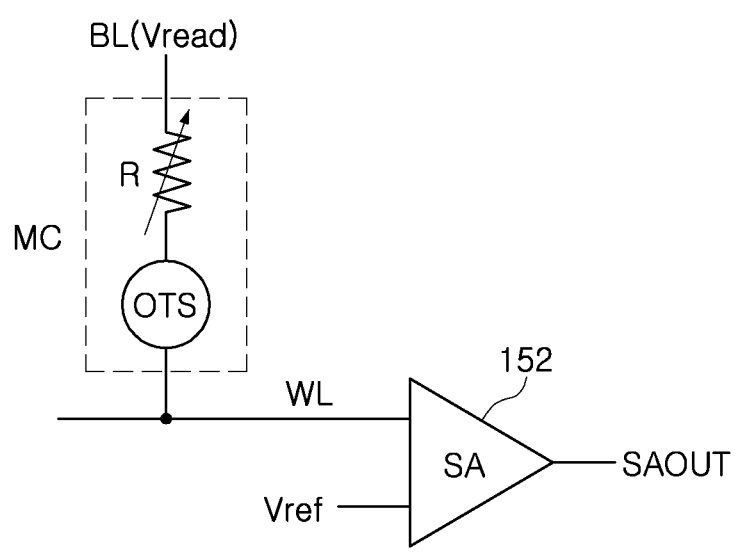
FIG. 8 is a diagram illustrating an example of a sense amplifier 152 of a read circuit 150 according to another example embodiment of the inventive concept.

FIG. 8 is a diagram illustrating an example of a sense amplifier 152 that may be included in the read circuit 150 of FIG. 1 according to another example embodiment. Referring to FIG. 8, the sense amplifier (SA) 152 may be used to compare a voltage of a word line WL connected to a memory cell MC with a reference voltage Vref in order to output a sensing result SAOUT. The memory cell MC may be disposed between a selected word line WL and a selected bit line BL. A read voltage Vread may be applied to the selected bit line BL during the read operation.

In an example embodiment, a level of the read voltage Vread may be varied in accordance with a selected write mode (e.g., a normal mode, a DCW mode, an aDCW mode, and a RDSKIP aDCW mode) for the write operation.

In another example embodiment, the level of the read voltage Vread may be varied in accordance with (or further in accordance with) an internal policy for the NVM device 100. For example, an internal policy may include an acceptable range of memory cell degradation, environmental information, timing information, etc. for the memory cell(s) of the NVM device 100.

In another example embodiment, the level of the read voltage Vread may be varied in accordance with (or further in accordance with) control information received from an external device (e.g., a memory controller).

The sense amplifier 152 illustrated in FIG. 8 is one selected example of a range of elements that may be used to accomplish the foregoing (e.g., sensing data by comparing a bit line voltage with the reference voltage Vref).

In the description that follows, a write operation performed according to a selected write mode will be described in some additional detail according to an example embodiment.

Figure 9A:
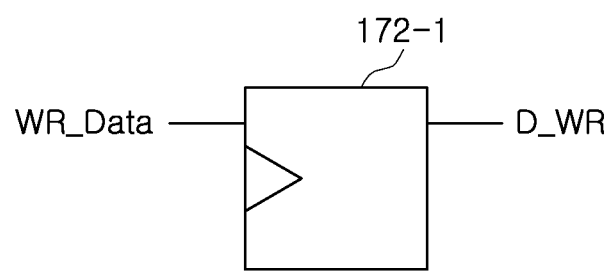
FIG. 9A is a diagram illustrating a write data latch 172-1.
Figure 9B:
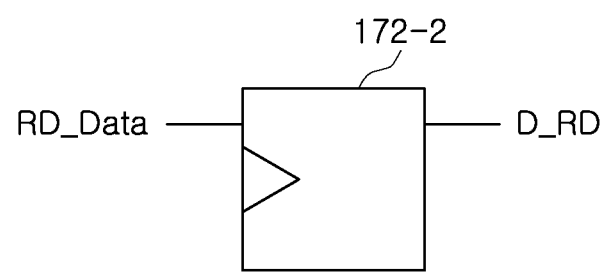
FIG. 9B is a diagram illustrating a write data latch 172-2, according to an example embodiment of the inventive concept.

FIG. 9A is a diagram illustrating a write data latch 172-1 and FIG. 9B is a diagram illustrating a write data latch 172-2 according to example embodiments. Referring to FIG. 9A, the write data latch 172-1 may include a flip-flop. Data to be written WR_Data may be output by the flip-flop. Referring to FIG. 9B, the write data latch 172-2 may include a flip-flop. Data RD_Data read out by the sense amplifier 152 illustrated in FIG. 8 may output read data D_RD by the flip-flop.

The data latches 172-1 and 172-2 illustrated in FIGS. 9A and 9B are implemented as flip-flops. However, the configuration of the data latches is not limited thereto.

Figure 10A:
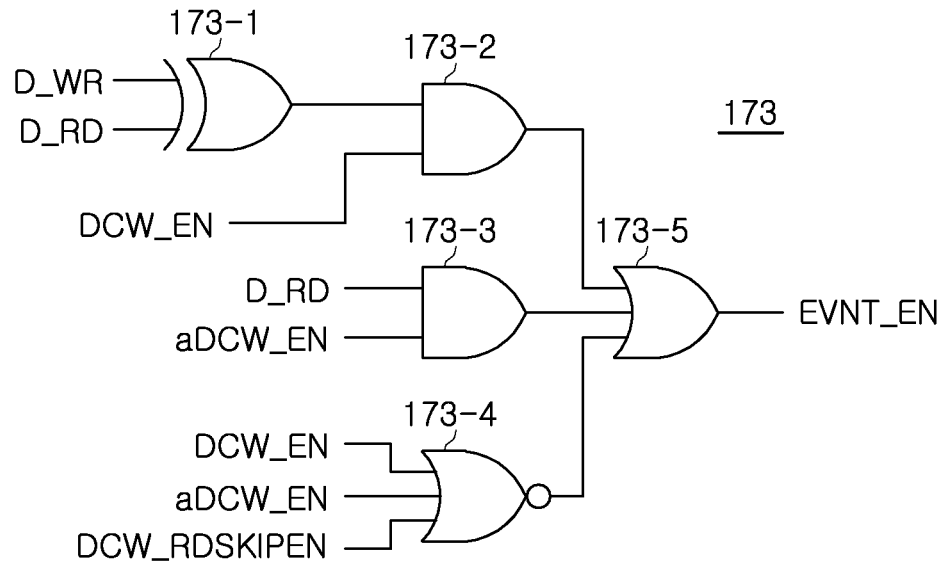
FIGS. 10A, 10B, and 10C are diagrams illustrating an example of control signals generated in control logic 170 according to an operational mode of a write operation.
Figure 10B:
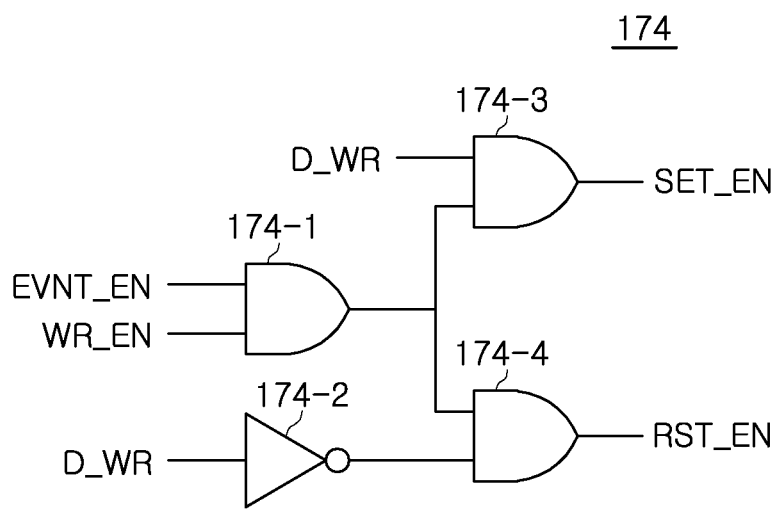
Figure 10C:
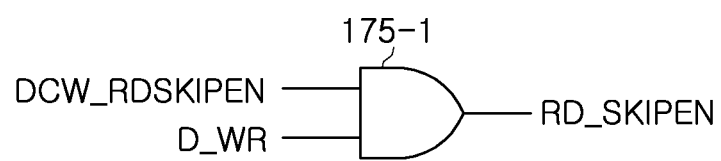

FIGS. 10A, 10B, and 10C are respective logic diagrams illustrating example(s) of control signals that may be generated by the control logic 170 of FIG. 1 according to a selected write mode.

Referring to FIG. 10A, an event activating signal generator 173 may include first to fifth logic circuits 173-1 to 173-5.

A first logic circuit 173-1 may XOR-calculate write data D_WR (see FIG. 9A) and read data D_RD. The second logic circuit 173-2 may AND-calculate an output of the first logic circuit 173-1 and a DCW mode activating signal DCW_EN. The third logic circuit 173-3 may AND-calculate the read data D_RD and an aDCW mode activating signal aDCW_EN. The fourth logic circuit 173-4 may NOR-calculate the DCW mode activating signal DCW_EN, the aDCW mode activating signal aDCW_EN, and a read skip DCW mode activating signal DCW_RDSKIPEN. The fifth logic circuit 173-5 may OR-calculate an output of the second logic circuit 173-2, an output of the third logic circuit 173-3, and an output of the fourth logic circuit 173-4 and may generate an event activating signal EVNT_EN.

However, the event activating signal generator illustrated in FIG. 10A is merely an example.

Referring to FIG. 10B, a write control signal generator 174 may include sixth to ninth logic circuits 174-1 to 174-4. The sixth logic circuit 174-1 may AND-calculate an event activating signal EVNT_EN and a write activating signal WR_EN. The seventh logic circuit 174-2 may invert write data D_WR. The eighth logic circuit 174-3 may AND-calculate the write data D_WR and an output of the sixth logic circuit 174-1 and may generate a setting activating signal SET_EN (the write control signal). The ninth logic circuit 174-4 may AND-calculate an output of the sixth logic circuit 174-1 and an output of the seventh logic circuit 174-2 and may generate a resetting activating signal RST_EN (the write control signal).

Referring to FIG. 10C, a read control signal generator 175 may include a tenth logic circuit 175-1. The tenth logic circuit 175-1 may AND-calculate a read skip DCW mode activating signal DCW_RDSKIPEN and the write data D_WR and may generate a read skip activating signal RD_SKIPEN (the read control signal).

A resistance value of the resistive memory cell may drift over time such that a distribution of resistance values for the memory cell expands.

Figure 11:
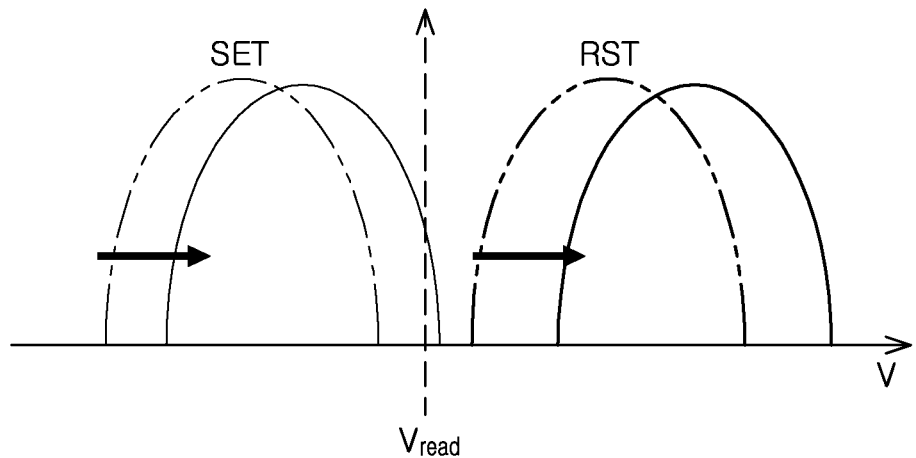
FIG. 11 is a diagram illustrating an example of distribution of a memory cell after a write operation performed in a normal mode.

FIG. 11 is a diagram illustrating an example of a memory cell voltage distribution following a write operation performed according to the normal mode. Referring to FIG. 11, a memory cell in a set state or a reset state may drift over time after a write operation. As illustrated in FIG. 11, as an example of a worst case, partial memory cells which drifted greatly in a set state may exceed a read voltage Vread. In this case, when the read operation is performed using the read voltage Vread, although the memory cells were programmed in a set state, the memory cells may be recognized as being programmed in a reset state. Accordingly, when the DCW mode is activated, it may be difficult to accurately identify memory cell states due to the previous distribution subject to drifting.

Thereafter, a write operation may be performed according to the DCW mode when memory cell state(s) have drifted.

Figure 12:
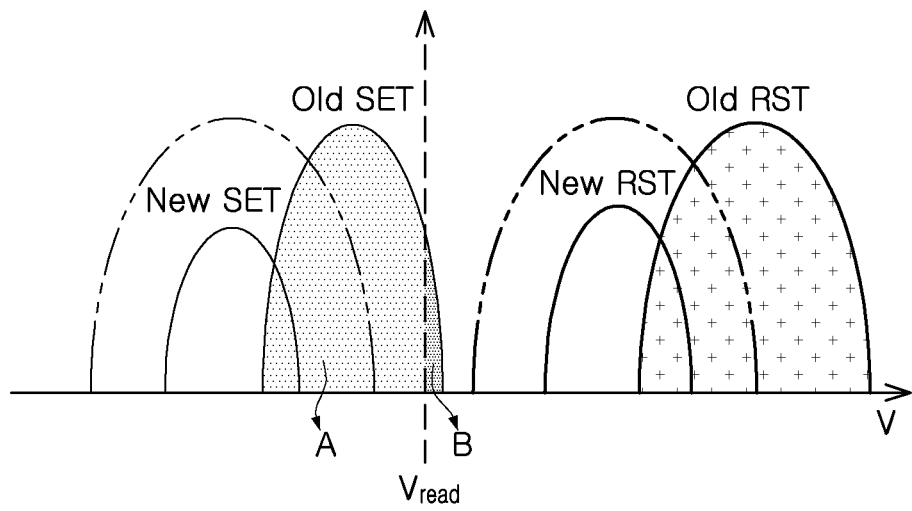
FIG. 12 is a diagram illustrating an example of distribution of a memory cell after a write operation performed in a DCW mode.

FIG. 12 is a diagram illustrating an example of a memory cell distribution following a write operation performed according to the DCW mode. Referring to FIG. 12, the distribution of the memory cells may be represented by one of four states. That is, following a write operation according to the DCW mode, the state of the memory cell may be one of an old set state Old SET, a new set state New SET, an old reset state Old RST, and a new reset state New RST. Here, the old set state refers to a state in which a set state has been maintained, the new set state refers to a state in which a state has been programmed from a reset state to a set state, the old reset state refers to a state in which a reset state has been maintained, and the new reset state refers to a state in which a state has been programmed from a set state to a reset state.

The issues occurring due to a write operation performed according to the DCW mode may include: 'A' cells which do not exceed the read voltage Vread in a drifted set state, and 'B' cells which exceed the read voltage Vread in a drifted set state.

FIG. 13 is data table listing outcomes for a write operation performed in accordance with the DCW mode. In the description that follows, set data (i.e., a set memory cell state) is assumed to correspond to a data value of "1," and reset data (i.e., a reset memory cell state) is assumed to correspond to a data value of "2." However, data values corresponding to the set and reset memory cell states are not limited thereto.

Referring to FIG. 13, the outcome of a write operation performed in accordance with the DCW mode may vary in relation to old data, read data (sensing data), and write data.

When the old data is "1," the memory cell may be in a drifted set state. As illustrated in FIGS. 1 and 2, the drifted set state may be divided into a first distribution of A cells in which the cell does not exceed the read voltage Vread and a second distribution of B cells in which the cell exceeds the read voltage Vread. Accordingly, the read data D_RD (see FIG. 9A; data stored in a read latch) read out in the read operation may be represented by one of "1" and "0."

The memory cell in which old data is "1" and the read data D_RD is "1" may refer to a memory cell included in the first distribution A which has drifted but remains in a set state. When the write data D_WR (see FIG. 9B; the data stored in the write latch) in the memory cell in the first distribution A is "1," the write operation may not be necessary. When the write data D_WR in the memory cell in the second distribution B is "0," a reset operation RST may be performed to the memory cell.

The memory cell in which old data is "1" and the read data D_RD is "0" may refer to a memory cell included in the second distribution B, which may be recognized as being in a reset state due to an excessive drift. When the write data D_WR in the memory cell in the second distribution B is "1," a set operation SET may be performed to the memory cell. When the write data D_WR in the memory cell in the second distribution B is "0," no operation may be performed to the memory cell. Accordingly, the memory cell may have meta-state data.

When old data is "0," the memory cell may be in a drifted reset state. When the write data D_WR is "1" in the memory cell in which the read data D_RD is "0," a set operation may be performed to the memory cell. When the write data D_WR is "0" in the memory cell in which the read data D_RD is "0," no operation may be performed to the memory cell.

FIGS. 14, 15 and 16 are data tables variously illustrating read/write data relationships in relation to write modes according to an example embodiment.

Referring to FIG. 14, a setting/reset operation may be performed according to the read data D_RD and the write data D_WR.

When the read data D_RD is "1" and the write data D_WR is "1," no write operation may be performed in a DCW mode, but a set operation may be performed in an aDCW mode. When the read data D_RD is "1" and the write data D_WR is "0," a reset operation may be performed in both the DCW mode and the aDCW mode. When the read data D_RD is "0" and the write data D_WR is "1," a set operation may be performed according to both the DCW mode and the aDCW mode. When the read data D_RD is "0" and the write data D_WR is "0," no write operation may be performed in both the DCW mode and the aDCW mode.

Accordingly, when the read data D_RD and the write data D_WR are the same in the DCW mode, the write operation may be prevented, and when the read data D_RD and the write data D_WR are "0" (a reset state) in the aDCW mode, the write operation may be prevented.

Referring to FIG. 15, a set/reset operation may be performed as below according to old data, read data D_RD, and write data D_WR.

In a memory cell in which the old data is "1" (a set state) and the read data D_RD is "1," when write data D_WR is "1," a set operation may be performed to the memory cell. In a memory cell in which the old data is "1" (a set state) and the read data D_RD is "1," when the write data D_WR is "0," a reset operation may be performed to the memory cell.

A read voltage used in a write operation performed according to the aDCW mode may be greater than or equal to a read voltage Vread used in the normal mode. Accordingly, a drifted memory cell in a reset state may be recognized as being in a set state. That is, although the old data may be "0," the read data D_RD may be "1" or "0."

In the memory cell in which the old data is "0" (a reset state) and the read data D_RD is "1," when the write data D_WR is "1," a set operation may be performed to the memory cell. The configuration may correspond to a metadata state illustrated in FIG. 13. In the memory cell in which the old data is "0" (a reset state) and the read data D_RD is "1," when the write data D_WR is "0," a reset operation may be performed to the memory cell.

In the memory cell in which the old data is "0" (a reset state) and the read data D_RD is "0," when the write data D_WR is "1," a set operation may be performed to the memory cell. In the memory cell in which the old data is "0" (a reset state) and the read data D_RD is "0," when the write data D_WR is "0," no operation may be performed to the memory cell.

In the example embodiment, a read skip may be applied according to data to be written in the aDCW mode. For example, when the write data is set data, a read skip may not be necessary.

Referring to FIG. 16, a read skip aDCW mode may be added in a write operation mode, different from the example illustrated in FIG. 14. When the write data D_WR is "0" and the read data D_RD is "0," a write operation may not be performed in the read skip aDCW mode. When the write data D_WR is "0" and the read data D_RD is "1," a set operation may be performed in the read skip aDCW mode. When the write data D_WR is "1" and the read data D_RD is "0," a reset operation may be performed in the read skip aDCW mode. When the write data D_WR is "1" and the read data D_RD is "1," a set operation may be performed in the read skip aDCW mode.

Figure 17:
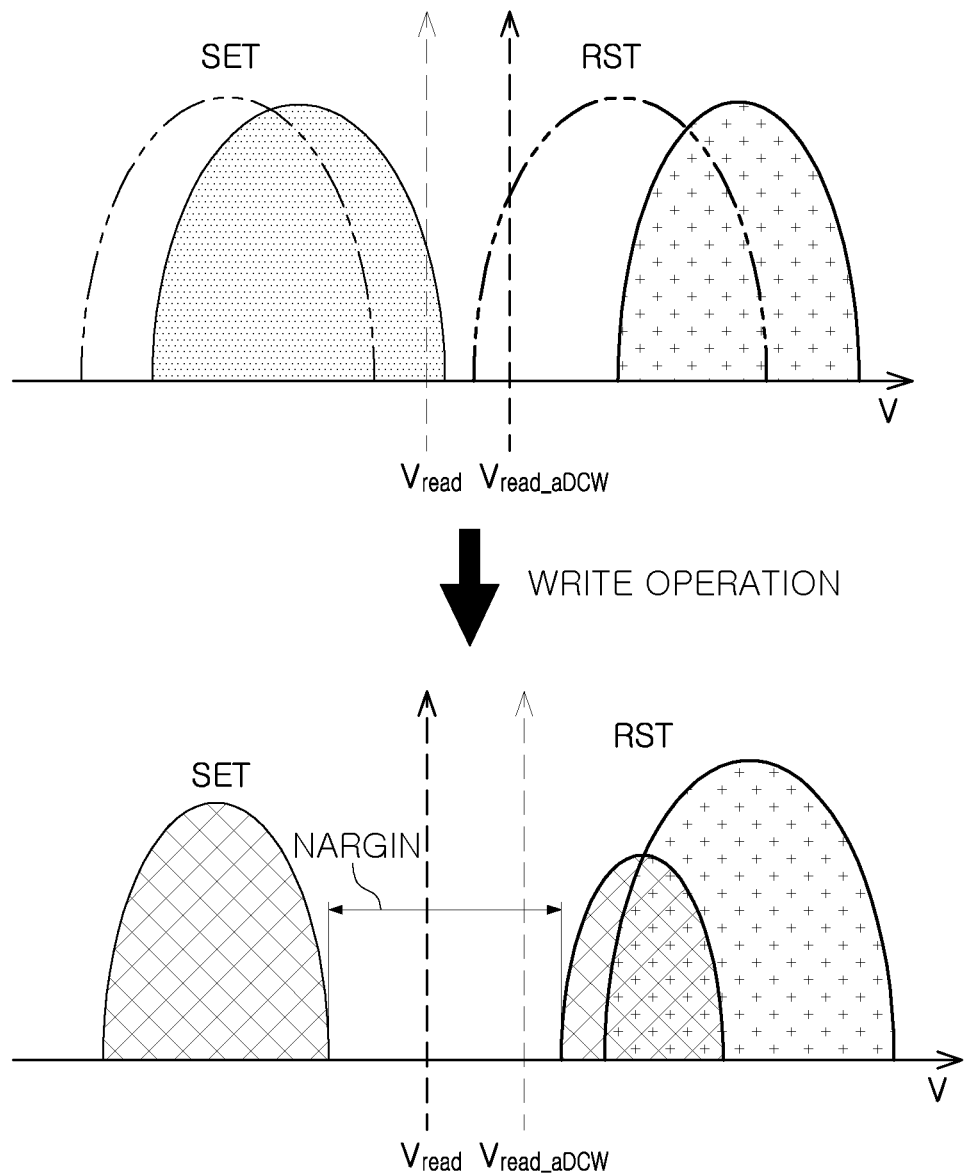
FIG. 17 is a diagram illustrating an example of distribution of when a write operation is performed in an aDCW mode according to an example embodiment of the inventive concept.

FIG. 17 is a diagram illustrating an example of memory cell distribution when a write operation is performed according to the aDCW mode according to an example embodiment. Referring to FIG. 17, when a write operation is performed according to the aDCW mode, a read skip (a sensing operation) may be performed using a read voltage Vread_aDCW determined to be greater than or equal to that of a read voltage Vread used in the normal mode. When the aDCW write operation is performed according to the read data D_RD obtained by the read operation described above, a data comparison write operation which does not include a meta state may be performed. As illustrated in FIG. 17, a memory cell in a reset state may be have drifted, and the write operation may be performed regardless of data in a set state such that a relatively wide margin may be secured.

The distribution illustrated in FIG. 17 is an example in which all of the memory cells in a set/reset state have drifted under the influence of write operation(s). However, an example embodiment thereof is not limited thereto.

Figure 18:
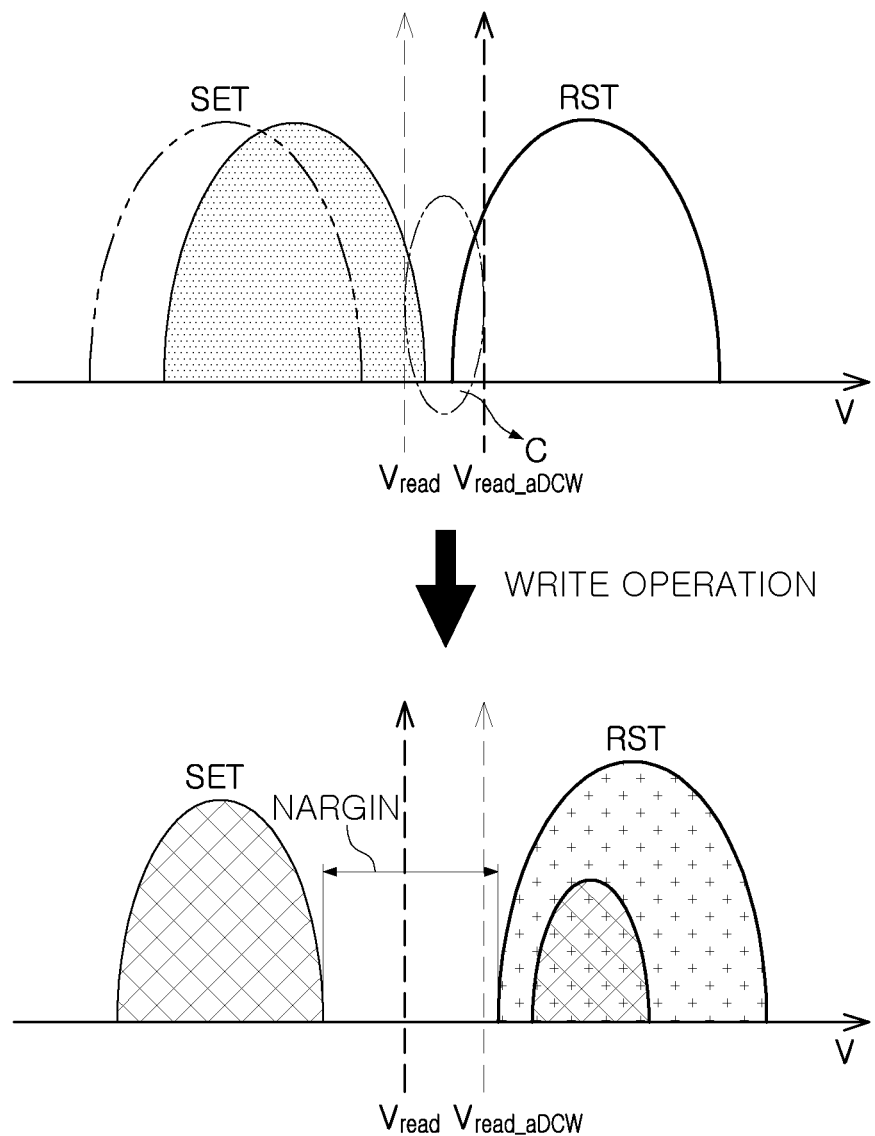
FIG. 18 is a diagram illustrating an example of distribution of when a write operation is performed in an aDCW mode according to another example embodiment of the inventive concept.

FIG. 18 is a diagram illustrating an example of memory cell distribution when a write operation is performed according to the aDCW mode according to another example embodiment. Referring to FIG. 18, when only memory cells in a set state have drifted following a write operation or when a drifting speed for the memory cells in a set state is greater than a drifting speed of memory cells in a reset state, distribution corresponding to a set state may partially overlap distribution corresponding to a reset state. When a write operation performed in accordance with the aDCW mode is performed, a set operation or a reset operation may be performed using a read voltage Vread_aDCW.

A memory cell of which old data is "0" in an overlapping portion C may be maintained as is when write data is "0." A memory cell of which old data is "1" in the overlapping portion C may perform a set operation or a reset operation according to write data D_WR. Accordingly, a sensing margin between a set state and a reset state may be sufficiently secured as illustrated in FIG. 18.

A write operation performed according to the aDCW mode may decrease a writing stabilization time tWTR, as compared with a write operation performed according to the DCW mode. The writing stabilization time tWTR may include a time period during which a write operation is performed and a time during which a non-crystalline state of a phase change material included in a resistive memory cell is stabilized by heat. The stabilized state may refer to a state in which a sufficient drift for a memory cell in a reset state is stabilized.

Figure 19:
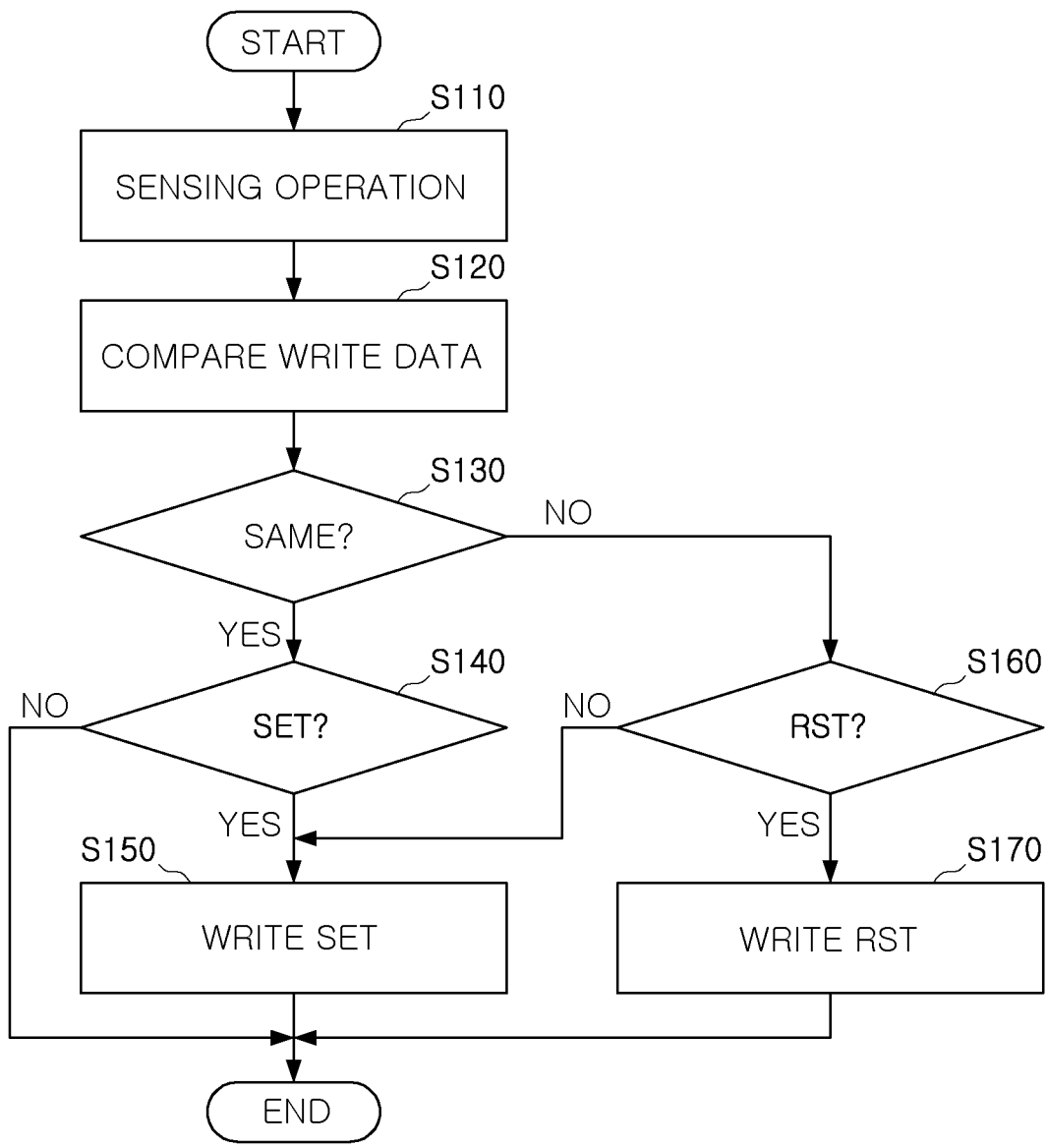
FIG. 19 is a flowchart illustrating an example of a write operation of a non-volatile memory device 100 according to an example embodiment of the inventive concept.

FIG. 19 is a flowchart summarizing one example of a writing method (or performance of a write operation) that may be used by the NVM device 100 of FIG. 1 according to an example embodiment.

Referring to FIGS. 1 to 19, when a write command, an address, and write data are received from an external entity (e.g., a memory controller), a sensing operation may be performed for data of a memory cell corresponding to the address (S110). Write data D_WR may be compared with the read (or sense) data obtained by the sensing operation, read data D_RD (S120). A determination is made as to whether the write data D_WR is the same as the read data D_RD (S130).

When the write data D_WR is the same as the read data D_RD (S130=YES), a further determination is may as to whether the write data D_WR is set data (S140). When the write data D_WR is set data (S140=YES), a set operation may be performed to a memory cell (S145). When the write data D_WR is not set data (S140=NO), the write operation is ended.

However, when the write data D_WR is not the same as the read data D_RD (S130=NO), a further determination is made as to whether the write data D_WR is reset data (S160). When the write data D_WR is not reset data (S160=NO), a set operation may be performed to a memory cell (S150). And when the write data D_WR is reset data (S160=YES), a reset operation may be performed to a memory cell (S170).

In a writing method (or in performance of a write operation) performed in accordance with example embodiments of the inventive concept, a data comparison write DWC method may be used and a read skip may be simultaneously applied according to write data.

Figure 20:
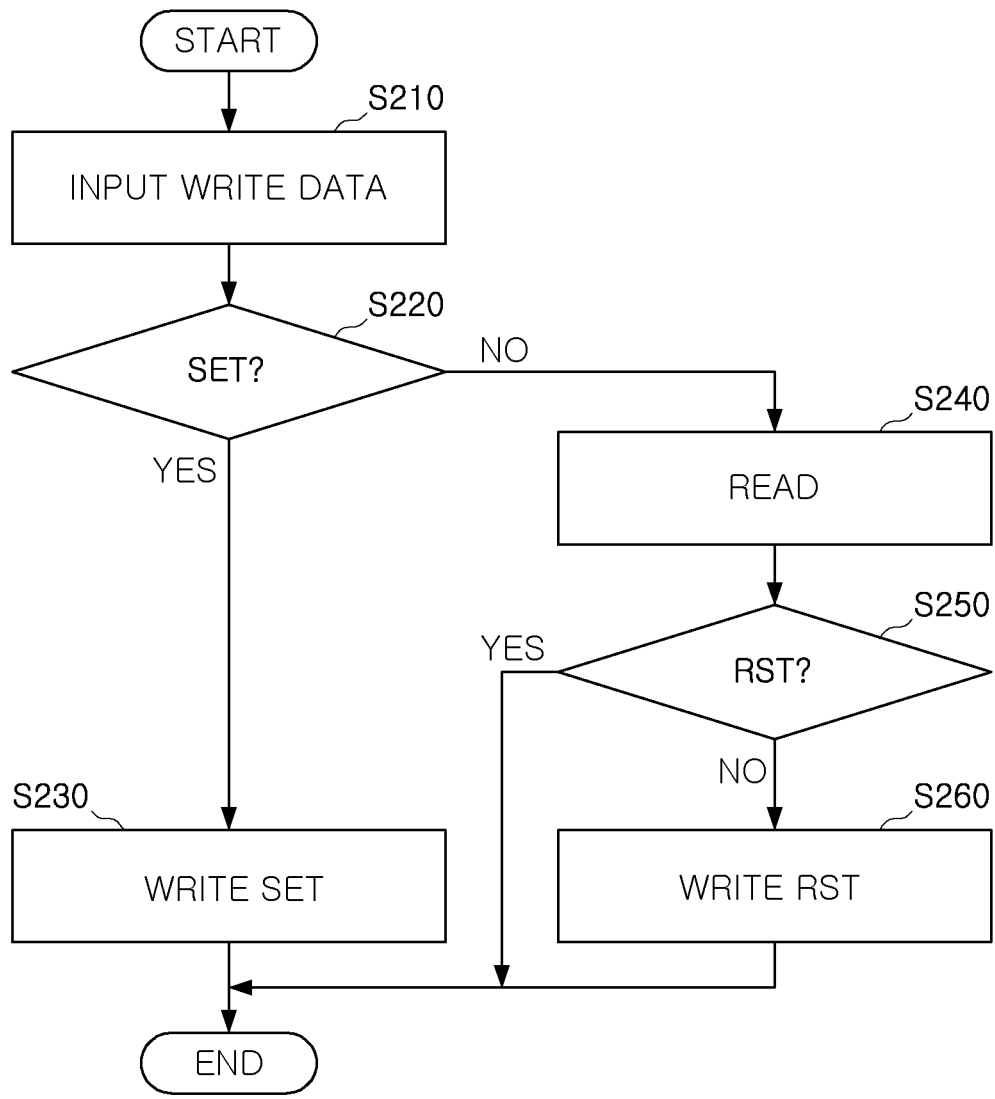
FIG. 20 is a flowchart illustrating an example of a write operation of a non-volatile memory device 100 according to another example embodiment of the inventive concept.

FIG. 20 is another flowchart illustrating an example of a writing method (or performance of a written write operation that may be used by the NVM device 100 of FIG. 1 according to another example embodiment.

Referring to FIGS. 1 to 10, the NVM device 100 may receive a write command, write data, and/or an address from an external entity (S210). It may then determine whether write data D_WR is set data (e.g., a data value of "1") corresponding to a set state (S220). When the write data D_WR is "1" (S220=YES), a set operation may be performed to a memory cell corresponding to an address (S230).

However, when the write data D_WR is reset data (e.g., a data value of "0") corresponding to a reset state (S220=NO), a read operation may be performed from a memory cell corresponding to an address (S240). The read operation may be performed using a read voltage determined to be greater than or equal to a read voltage used during a normal mode.

If the read operations determines that the resulting read data D_RD is reset data (S250=YES), then a write operation may not be performed. However, when the read data D_RD is not reset data (S250=NO), a reset operation may be performed to a memory cell (S260).

Figure 21:
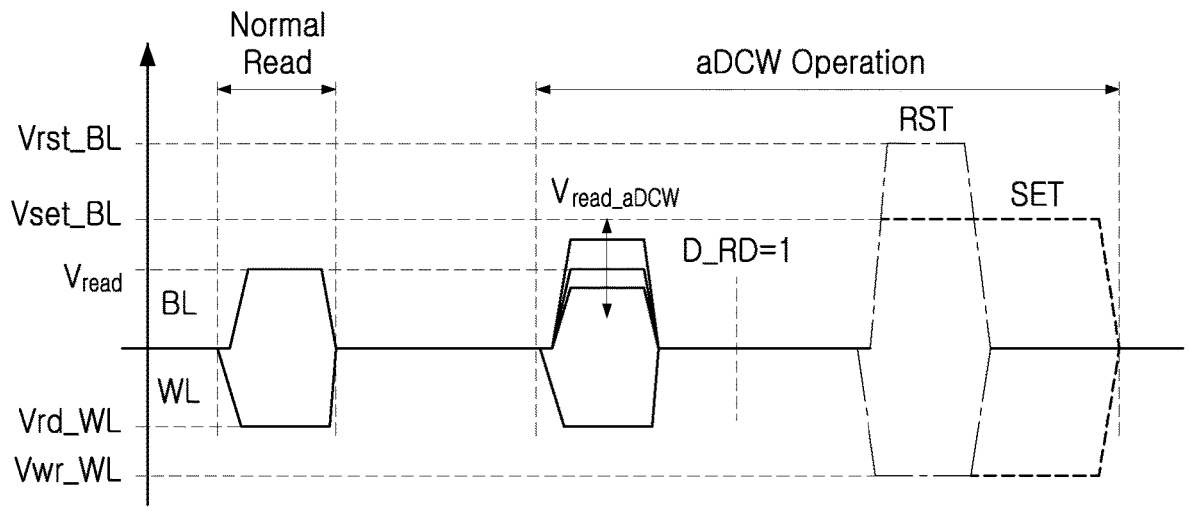
FIG. 21 is a diagram illustrating an example of a timing of an operation of write data "1" in an aDCW mode according to an example embodiment of the inventive concept.
Figure 22:
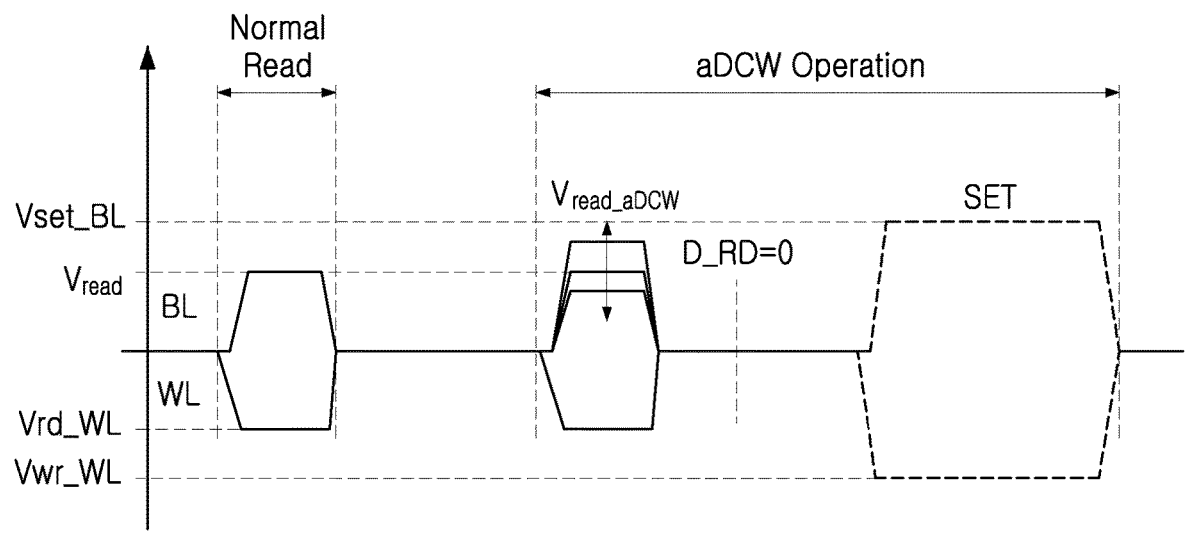
FIG. 22 is a diagram illustrating an example of a timing of an operation of write data "0" in an aDCW mode according to an example embodiment of the inventive concept.

FIGS. 21 and 22 are timing diagrams. FIG. 21 illustrates a timing example for a write operation writing data "1" according to the aDCW mode according to an example embodiment. Referring to FIG. 21, in a read operation in a normal mode, a read voltage Vread of a first read level may be applied to a bit line BL, and a read word line voltage Vrd_WL may be applied to a word line WL.

In a read operation according to the aDCW mode, a read voltage Vread_aDCW having a second read level may be applied to the bit line BL, and a read word line voltage Vrd_WL may be applied to the word line WL. The read voltage Vread_aDCW may be variable. In an example embodiment, the read voltage Vread_aDCW having a second read level may be greater than a read voltage Vread having a first read level of a normal mode.

In a write operation according to the aDCW mode, a reset pulse or a set pulse may be applied to the bit line BL/ word line WL. The reset pulse may have a relatively high amplitude and a relatively short application time as compared to the set pulse. For example, in the reset operation, a reset bit line voltage Vrst_BL may be applied to a bit line and a write word line voltage Vwr_WL may be applied to a word line. Also, in a set operation, a set bit line voltage Vset_BL may be applied to a bit line, and a write word line voltage Vwr_WL may be applied to a word line.

In an example embodiment, the read word line voltage Vrd_WL and the write word line voltage Vwr_WL may be negative voltages.

In an example embodiment, the reset bit line voltage Vrst_BL may be greater than the set bit line voltage Vset_BL.

FIG. 22 illustrates a timing example of an operation of write data "0" according to the aDCW mode according to an example embodiment. Referring to FIG. 22, timing of a write operation illustrated in FIG. 22 may not include a reset pulse, different from the timing of a write operation illustrated in FIG. 21. Accordingly, different from the foregoing example embodiment, a set pulse corresponding to a set state may be applied to a bit line BL/word line WL in the example embodiment illustrated in FIG. 21, and the other operations may be the same as in the foregoing example embodiment.

Figure 23A:
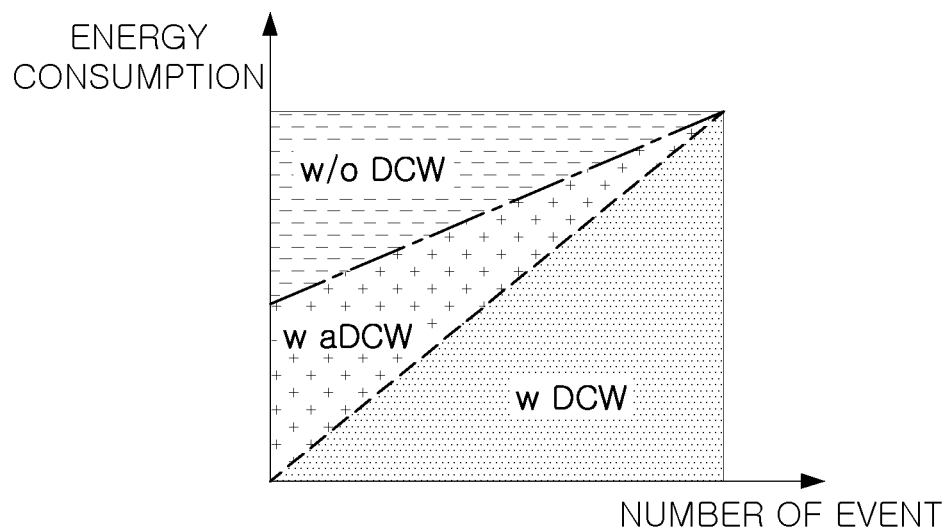
FIGS. 23A and 23B are diagrams illustrating an effect of a write operation of a non-volatile memory device according to an example embodiment of the inventive concept.
Figure 23B:
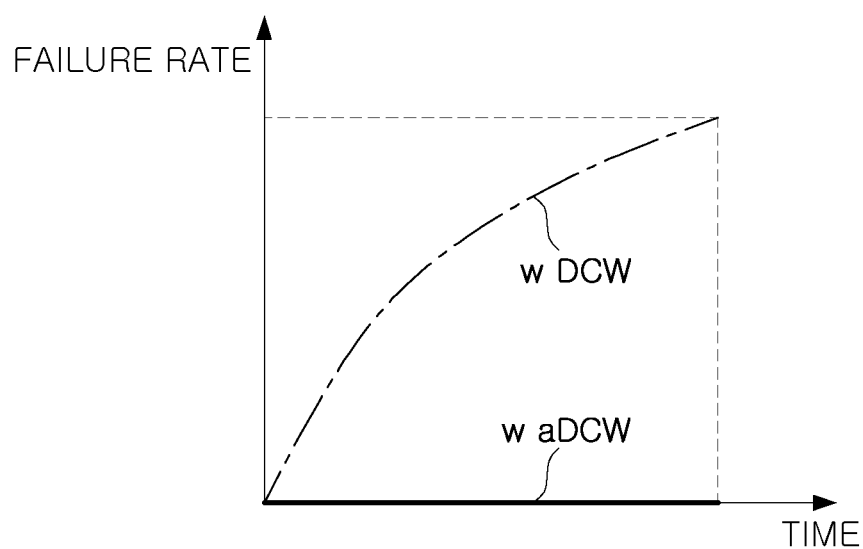

FIGS. 23A and 23B are graphs further illustrating various effects of a write operation for a NVM device according to an example embodiment. Referring to FIG. 23A, energy consumption for each write mode is compared. A write mode with (w) DCW may consume the least energy, a write mode with aDCW may consume the second highest energy, and a write mode without (w/o) DCW may consume the highest energy. Referring to FIG. 23B, a failure rate of each write mode is shown. A failure rate for write mode with DCW may increase over time, whereas a failure rate for write mode with aDCW may be 0 over time.

Figure 24:
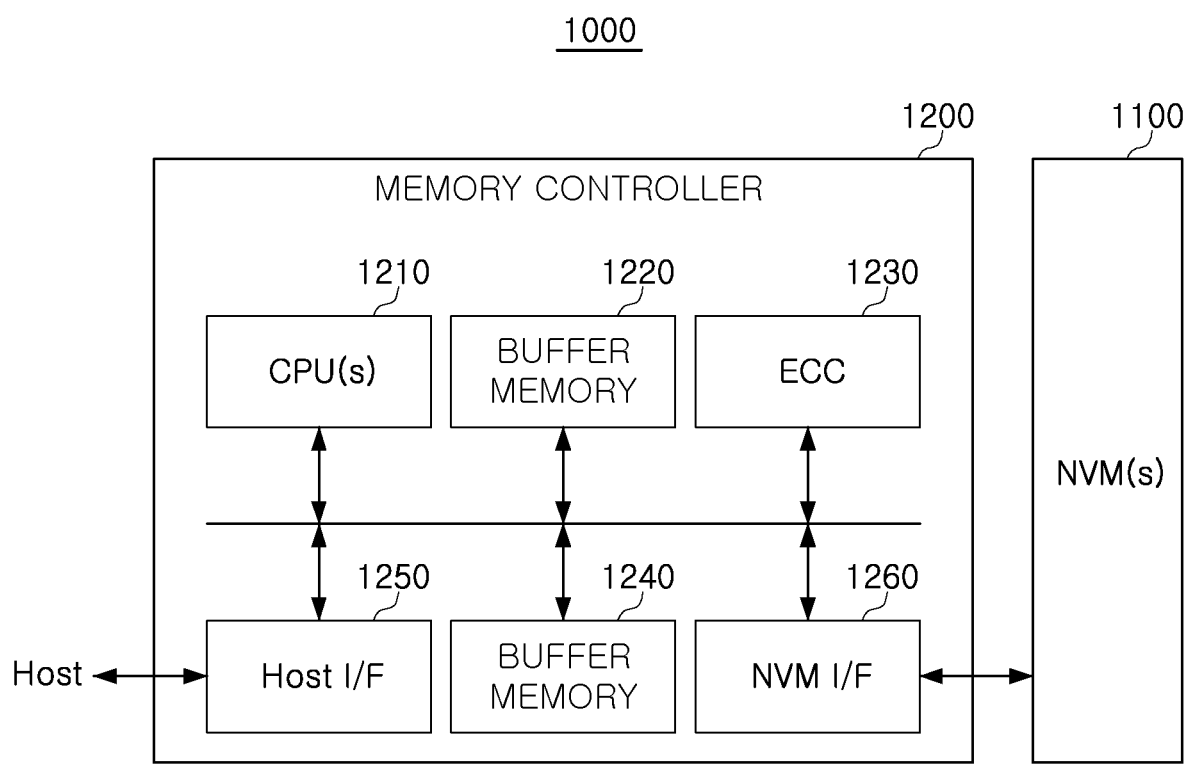
FIG. 24 is a diagram illustrating an example of a storage device 1000 according to an example embodiment of the inventive concept.

FIG. 24 is a diagram illustrating a storage device 1000 according to an example embodiment. Referring to FIG. 24, the storage device 1000 may include at least one non-volatile memory (NVM) device 1100 and a memory controller 1200.

To reduce power consumption and also improve data reliability during a write operation, the NVM device 1100 may be implemented using a NVM device and writing method according to embodiments of the inventive concept, like those described in relation to FIGS. 1 to 22. In an example embodiment, the NVM device 1100 may (optionally) be configured to receive an external high voltage Vpp.

The memory controller 1200 may be connected to the NVM device 1100. The SSD controller 1200 may include at least one processor (CPU(s)) 1210, a buffer memory 1220, an error correction circuit 1230, a code memory 1240, a host interface 1250, and a NVM interface 1260.

The processor 1210 may be configured to control overall operations. The processor 1210 may be implemented as a central processing unit (CPU) or an application processor (AP).

The buffer memory 1220 may temporarily store data required for operation of the memory controller 1200. The buffer memory 1220 illustrated in FIG. 24 may be disposed in the memory controller 1200, but an example embodiment is not limited thereto. The buffer memory 1220 in the example embodiment may be disposed in a separate intellectual property arranged externally of the memory controller 1200.

The error correction circuit 1230 may calculate an error correction code value of data to be programmed in a write operation, may correct an error of the data read out on the basis of the error correction code value in a read operation, and may correct an error of data recovered from the NVM device 1100 in a data recovery operation. The error correction circuit 1230 may correct an error using a coded modulation such as a low density parity check (LDPC) code, a BCH code, a turbo code, a Reed-Solomon code, a convolution code, a recursive systematic code (RSC), a trellis-coded modulation (TCM), a block coded modulation (BCM), or the like. The code memory 1240 may store code data required for operating the memory controller 1200. The code memory may be implemented as a NVM device. The host interface 1250 may provide a function of interfacing with an external device. The NVM interface 1260 may provide a function of interfacing with the NVM device 1100. Although not illustrated in the diagram, the memory controller 1200 may include a wireless communications function (e.g., Wi-Fi).

A storage device 1000 may include a NVM device capable of performing a write mode providing increase immunity against resistance drift while reducing power consumption, thereby significantly improving a system performance.

The NVM device in the example embodiment may perform an optimal write mode depending on, among other conditions, the position of a memory cell within the memory cell array.

Figure 25:
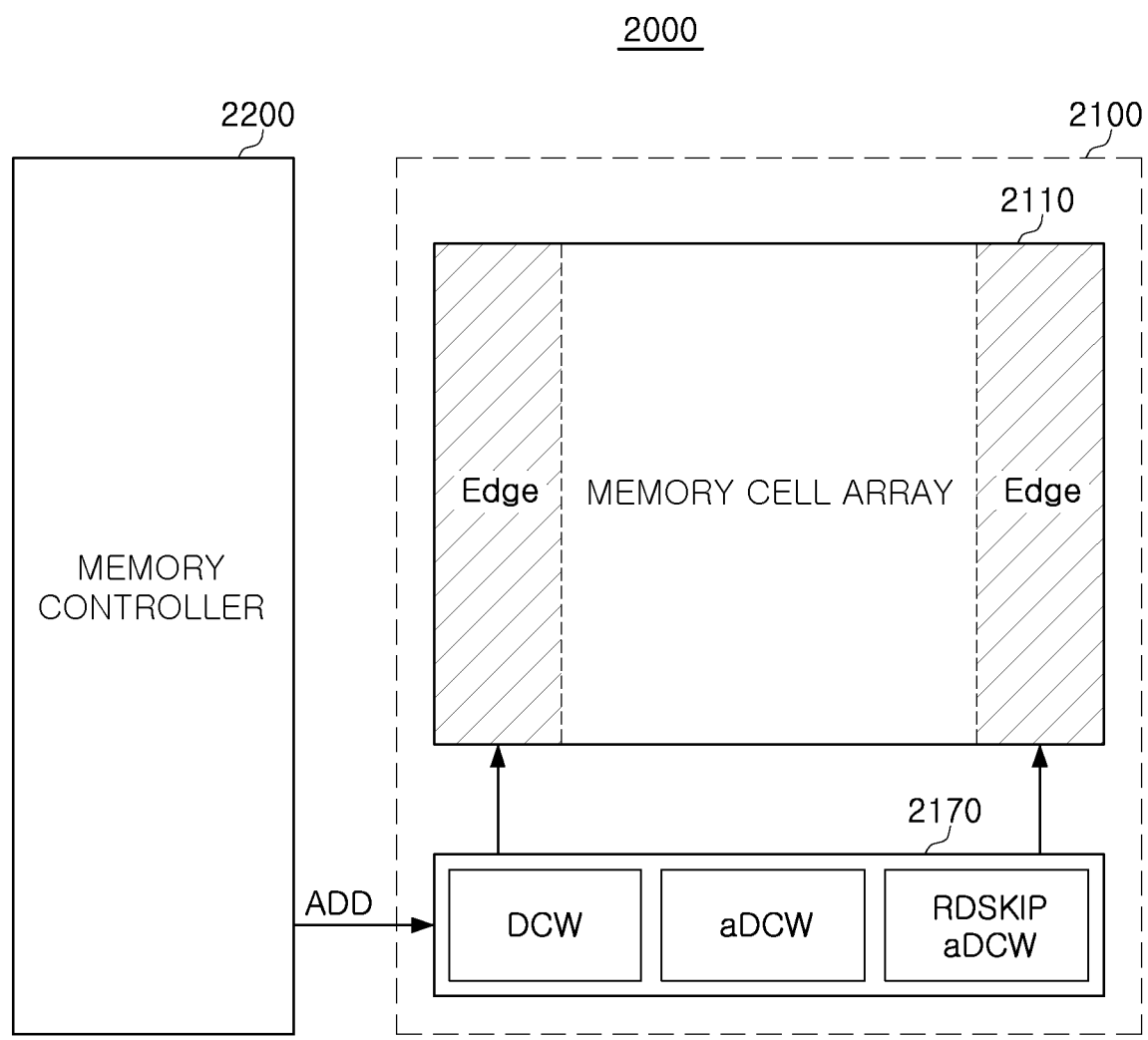
FIG. 25 is a diagram illustrating an example of a memory system 2000 in which a certain write mode is applied to an edge portion according to an example embodiment of the inventive concept.

FIG. 25 is a diagram illustrating an example of a memory system 2000 in which a certain write mode is applied to memory cells disposed in an edge portion according to an example embodiment. The memory system 2000 generally includes a memory controller 2200 and a storage device 2100 including a NVM device according to embodiments of the inventive concept. Referring to FIG. 25, when an address ADD is received in the storage device 2100 from the memory controller 2200, control logic 2170 may determine whether the memory cell(s) indicated (e.g.,) by a received address are disposed in an edge portion of a memory cell array 2110. Based on this determination, the control logic 2170 may select a corresponding write mode for the write operation to be performed.

Here, different write modes may be used depending on environmental conditions (e.g., temperature), memory cell information (e.g., lifespan, degree of degradation, bit error rate, etc.) and the like.

Figure 26:
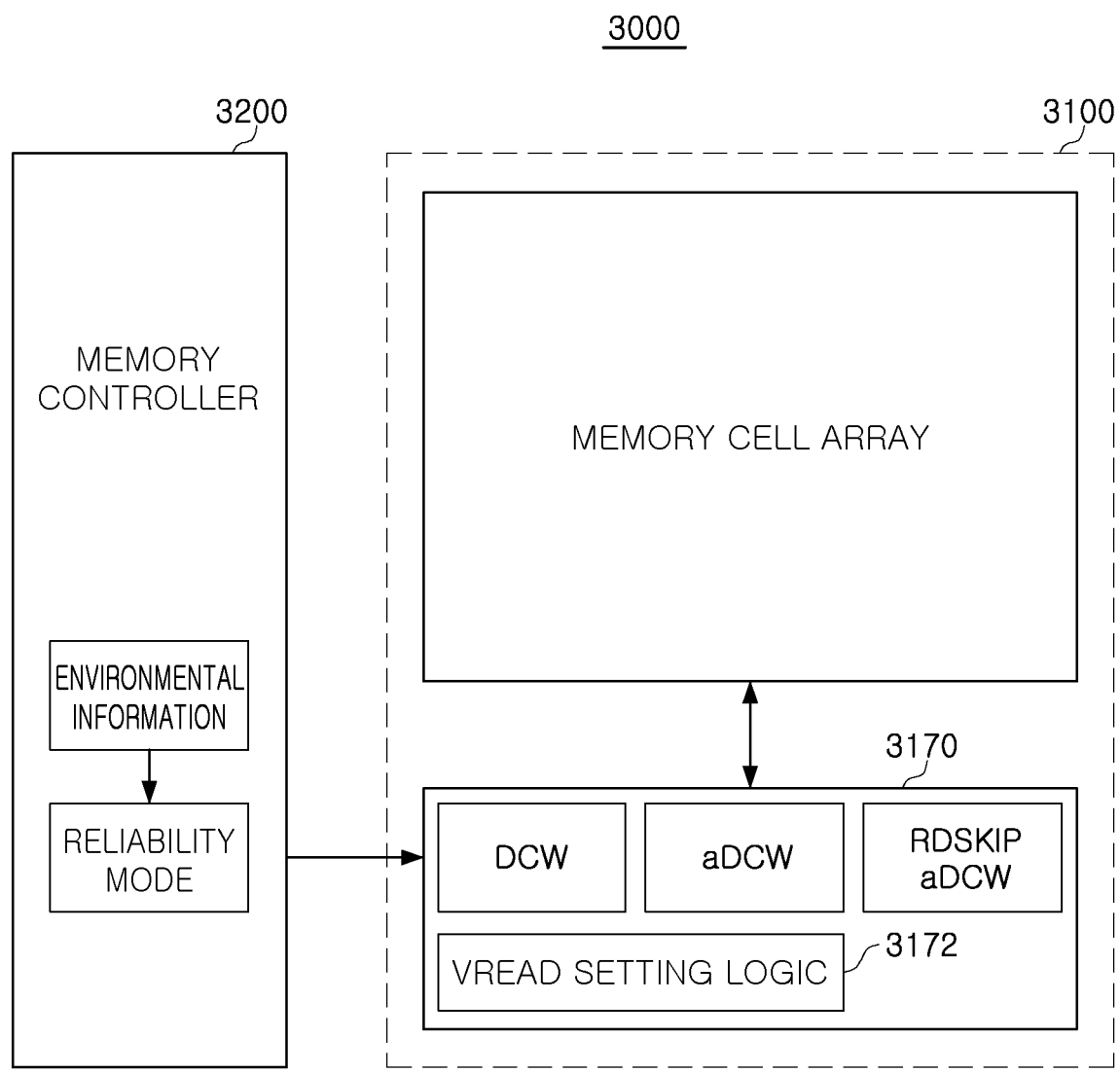
FIG. 26 is a diagram illustrating an example of a memory system 3000 which selectively operates a write mode according to environmental information according to an example embodiment of the inventive concept.

FIG. 26 is a diagram illustrating an example of a memory system 3000 which selectively performs written operations according to variously selected write modes in view of environmental conditions according to an example embodiment. Referring to FIG. 26, a memory controller 3200 may collect environmental information, and may select an optimal reliability write mode on the basis of the collected information.

In an example embodiment, environmental information may include cycle information relating to the number of a write operation or a read operation performed to a memory cell, temperature information, a number of bit errors, etc.

A memory controller 3200 may communicate write mode setting information to a NVM device 3100, and the NVM device 3100 may select a write mode on the basis of write mode setting information. The NVM 3100 may also change a level of a read voltage Vread according to a selected write mode.

In certain embodiments of the inventive concept, one or more NVM device(s) may be applied to a server system. For example, FIG. 27 is a diagram illustrating an example of a server system 4000 according to an example embodiment.

Figure 27:
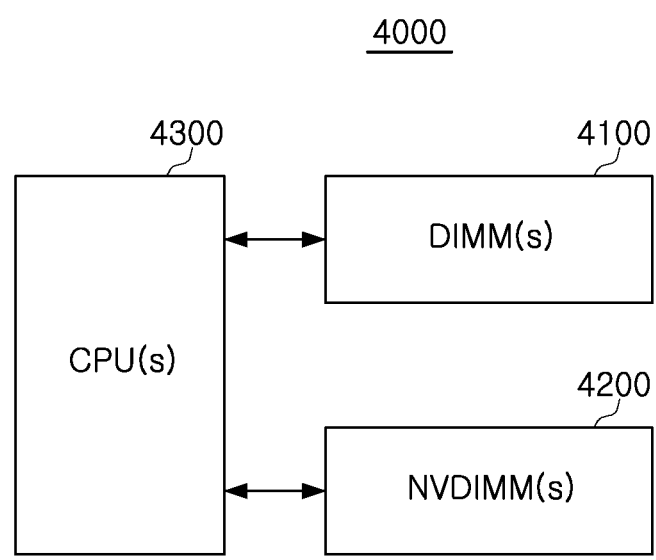
FIG. 27 is a diagram illustrating an example of a server system 4000 according to an example embodiment of the inventive concept.

Referring to FIG. 27, the server system 4000 may include at least one memory module 4100 (DIMM), at least one NVM module 4200 (NVDIMM), and at least one processor 4300. The at least one NVM module 4200 may include a NVM device like those previously described. Accordingly, the server system 4000 may enjoy increased data reliability with reduced power consumption such that the server system 4000 may perform data management in an economical manner.

The aforementioned example embodiments may be applied to various types of computing systems (e.g., a central processing unit (CPU)/graphic processing unit (GPU)/neural processing unit (NPU) platform).

Figure 28:
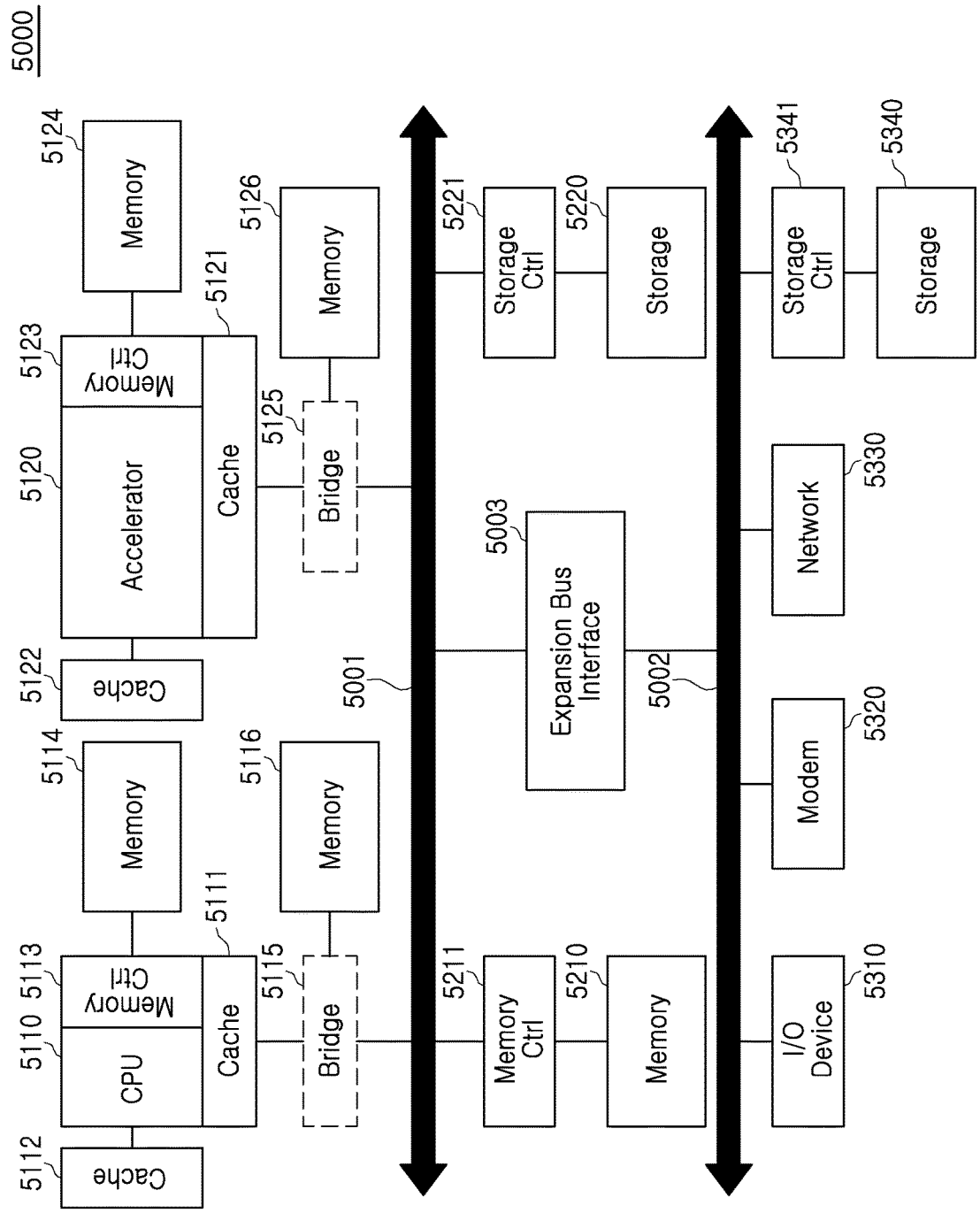
FIG. 28 is a diagram illustrating an example of a computing system 5000 according to an example embodiment of the inventive concept.

FIG. 28 is a diagram illustrating an example of a computing system 5000 according to an example embodiment. Referring to FIG. 25, the computing system 5000 may include a central processing unit (CPU) 5110 connected to a system bus 5001, an accelerator 5120, a memory device 5210 connected to the system bus 5001 or a storage device 5220, an I/O device 5310 connected to an expansion bus 5002, a modem 5320, a network device 5330, or a storage device 5340.

The system bus 5001 may be configured as a PCI bus or a PCI bus, and the expansion bus 5002 may be connected to the system bus 5001 through an expansion bus interface 5003. However, an example embodiment thereof is not limited thereto, and an I/O device, a modem, a network device, and the like, may be connected to the system bus. A peripheral device may directly access a main memory of a CPU by a DMA engine independently using a direct memory access method. A CPU may start a transfer operating and may perform other tasks, and when the transfer operation is terminated, the CPU may be interrupted from a DMA controller.

In an example embodiment of FIG. 28, the system bus 5001 or the expansion bus 5002 may be configured based on serial/parallel connection. The serial/parallel connection may use a multi-drop method, a daisy-chain method, a switched hub method, or the like.

In an example embodiment, the CPU 5110, the accelerator 5120, main memories 5114, and the storage device 5220 may be connected to each other by the system bus 5001. The accelerator may be configured as a GPU, an NPU, or an application-specialized processing device. In an example embodiment, the CPU 5110 and the accelerator 5120 may be configured as multi-cores.

Each of the CPU 5110 and the accelerator 5120 (a GPU, an NPU, or an application-specialized processing device) may have an on-chip cache, an off-chip cache, or a backside bus cache between the CPU 5110 and the accelerator 5120 and the system bus 5001. In an example embodiment, the off-chip caches 5112 and 5122 may be connected to the CPU 5110/the accelerator 5120 through a separate bus. In an example embodiment, the CPU 5110 and the accelerator 5120 may include on-chip caches 5111 and 5121. Each of the off-chip caches 5112 and 5122 may be connected to a corresponding CPU 5110 and a corresponding accelerator 5120. In an example embodiment, the on-chip/off-chip chip caches may include a volatile memory such as a dynamic random access memory (DRAM), a static random access memory (SRAM), or the like, or a NVM such as a NAND flash memory, a phase random access memory (PRAM), a resistive random access memory (RRAM), or the like.

The main memories 5114 and 5210 (e.g., memories other than a bridge memory or a memory associated with an accelerator) may be connected to the CPU 5110 and the accelerator 5120 through corresponding memory controllers 5113 and 5211. In an example embodiment, the main memories 5114 and 5210 may include a volatile memory such as a DRAM, an SRAM, or the like, or a NVM such as a NAND flash memory, a PRAM, or the like.

The main memory may communicate with the memory controller through a standard interface, DDR, LPDDR, GDDR, HBM, NVDIMM. The memory controller may send a command through a command chip and may send an address through an address pin, and may send and receive data through a DQ pin. In an example embodiment, a Din pin may be separated from a Dout pin. The memory controller may provide a CLK signal through a CLK pin, and may provide control signals for receiving other signals through corresponding pins, respectively (e.g., CS, CLE, ALE, WE, RE, DQS). The memory may provide data to the memory controller through a DQ pin, and may provide a control signal for receiving a signal through a corresponding pin (e.g., DQS). A portion of the control signals may be strobe signals. A portion of the above-mentioned pins may be merged. For example, a command pin and an address pin may be merged to be a CA pin.

When a processor (CPU/accelerator) uses a program and data, the program and the data may be maintained in the main memory or memories 5114, 5116, and 5210 for an accelerator. A certain program and data may be maintained in a memory for an accelerator specialized for the respective program and data. The main memory may be used as a space directly accessed in the CPU/accelerator. The main memory/memories for an accelerator may be used as an execution space of software when software is executed. When software is executed, the corresponding program and data that the processor uses may be copied from a storage device to the main memory or from the main memory to the storage device. A program and data related to application of an accelerator may be copied from the main memory or the storage device to the memory for an accelerator or from the memory for an accelerator to the main memory or the storage device. Also, if desired, only a portion of data used in the program may be copied to the main memory or the memory for an accelerator. Only a portion of data used in the program may be copied to the main memory or the memories 5114, 5116, and 5210 for an accelerator. In an example embodiment, the memory 5210 may be exclusively used for the CPU 5110 or may be shared with the CPU 5110 and the accelerator 5120. In an example embodiment, a partial area of the memory 5210 may be exclusively used for the accelerator 5120. In an example embodiment, the CPU 5110 and the accelerator 5120 may share a bridge.

Bridge memories 5116 and 5126 may be connected to the CPU 5110 and the accelerator 5120 through bridges 5115 and 5125. The bridges 5115 and 5125 may include memory controllers for controlling the corresponding memories 5116 and 5126. In an example embodiment, each of the bridges 5115 and 5125 may be implemented as a network device, a wireless network device, a switch, a bus, a cloud, or an optical channel.

For example, the CPU 5110 and/or accelerator 5120 may perform a write operation to a NVM device like those described above in relation to FIGS. 1 to 26. Memory controllers 5113/5123/5115/5125/5211 may receive a write command from the CPU 5110/accelerator 5120. The memory controllers 5113/5123/5115/5125/5211 may receive a write command and may perform a pre-read operation. The memory controllers 5113/5123 may compare read data resulting from the pre-read operation with write data, and may determine whether to perform an overwrite operation according to the comparison results.

In an example embodiment, the memories 5116 and 5126 may be connected to the CPU 5110 and the accelerator 5120 through the bridges 5115 and 5125. The bridges 5115 and 5125 may include memory controllers for controlling the corresponding memories 5116 and 5126. In an example embodiment, each of the bridges 5115 and 5125 may be implemented as a network device, a wireless network device, a switch, a bus, a cloud, or an optical channel.

In an example embodiment, the CPU 5110, the CPU caches 5111 and 5112, the accelerator 5120, or the accelerator caches 5121 and 5122 may be connected to a system bus 5001 through the corresponding bridges 5115 and 5125. In another example embodiment, the CPU 5110, the CPU caches 5111 and 5112, the accelerator 5120, or the accelerator caches 5121 and 5122 may be directly connected to the system bus 5001 without a bridge.

A single memory may be connected to each of the bridges 5115 and 5125 illustrated in FIG. 28, but an example embodiment thereof is not limited thereto. The number of the memories connected to the bridges 5115 and 5125 may be two or greater.

In an example embodiment, the memory 5126 may include a GPU memory, an NPU memory, or an application-specialized memory.

When the accelerator 5120 is configured as a GPU, the memories 5116 and 5126 may include a GPU memory. The GPU memory may maintain a command and data interacting with the main memory. The command and data may be copied in the main memory or a storage. The GPU memory may store image data, and may have a bandwidth higher than those of the main memory 5210/the CPU memory 5216. The GPU memory may use a clock different from clocks of the main memory 5210/the CPU memory 5216. The GPU may read image data from the GPU memory, may process the image data, and may write the image data in the GPU memory. The GPU memory may be configured to accelerate a graphics processing operation. In an example embodiment, the CPU may communicate with the main memory/the CPU memory through a DDR interface, and the GPU may communicate with the GPU memory through GDDR, HBM interface, and other interface specialized for a GPU memory. The GPU may be connected to the GPU memory through an interposer.

When the accelerator 5120 is configured as an NPU, the memories 5116 and 5126 may include an NPU memory. The NPU memory may maintain a command and data interacting with an NPU. The command and data may be copied in the main memory or a storage. The copying in the main memory may be performed through a CPU, or may be performed by a DMA method of a DMA engine. The NPU memory may maintain weight data for a neural network. The NPU memory may have a bandwidth higher than those of the main memory 5210/the CPU memory 5216. The NPU memory may use a clock different from clocks of the main memory 5210/the CPU memory 5216. The NPU may read weight data from the NPU memory, may update the data, and may use the data to the NPU memory during training. The NPU memory may be configured to accelerate machine learning such as a neural training and inference. In an example embodiment, the CPU may communicate with the main memory/the CPU memory through a DDR interface, and the NPU may communicate with the NPU memory through GDDR, HBM interface, and other interface specialized for a NPU memory. The NPU may be connected to the NPU memory through an interposer.

The CPU 5110 or the accelerator 5120 may access secondary storages 5210, 5220, and 5340 through the system bus 5001 or the expansion bus 5002. The memory 5210 may be controlled by the memory controller 5211. The memory controller 5211 may be connected to the system bus 5001. In an example embodiment, the memory 5210 may include a NVM device like those described in relation to FIGS. 1 to 26. The storage devices 5220 and 5340 may be controlled by storage controllers 5221 and 5341. The storage controllers 5221 and 5341 may be connected to the system bus 5001 or the expansion bus 5002. The storage devices 5220 and 5340 may be configured to store data. The storage controllers 5221 and 5341 may be configured to read out data from the corresponding storage device 5220 or the corresponding storage device 5340 and to transmit the read-out data to a host. The storage controllers 5221 and 5341 may be configured to store transmitted data in the corresponding storage device 5220 or the corresponding storage device 5340 in response to a request from the host.

The storage device may be connected to a storage device controller through SATA, SAS, SCSI, PCI, PCIe, AHCI, and NVMe interface. The storage device controller may send a command through a command pin and may send an address through an address pin, and may transmit and receive data through a DQ pin. In an example embodiment, a Din pin may be separated from a Dout pin. The storage device controller may provide a CLK signal through a CLK pin, and may provide control signals for receiving other signals through corresponding pins, respectively (e.g., CS, CLE, ALE, WE, RE, and DQS). The storage device may provide data to the storage device controller through a DQ pin, and may provide a control signal for receiving a signal through a corresponding pin (e.g., DQS). A portion of the control signals may be strobe signals. A portion of the above-mentioned pins may be merged. For example, a command pin and an address pin may be merged as a CA pin.

Each of the storage device 5220 and the storage controller 5221 may include a buffer for storing metadata, map data, or the like or a reading cache for storing frequently accessing data, or may include a write cache for improving a writing performance. For example, the write cache may store data for which request(s) for writing are frequently received, and may transfer a request for writing to a storage medium after a request for writing by a certain unit is received, rather than transferring the request whenever the request is received. In other words, requests for writing by bit unit may be preferentially stored in the write cache, and when requests for writing by certain unit is received, the received requests for writing may be transferred to a storage medium. For example, a certain unit may be the same as an operation unit (e.g., a page unit) of a flash memory. Thus, the certain unit may be a storage device friendly unit.

In an example embodiment, one or more of the elements illustrated in FIG. 28 may include a buffer. The buffer may be a volatile memory such as a SRAM, a DRAM, or may be a NVM such as a nonvolatile random access memory (NVRAM), a NAND flash memory, a NOR flash memory, a phase random access memory (PRAM), a storage class memory (SCM), or a new memory.

The storage device 5220 may include a volatile memory such as a hard disk drive (HDD), and may include a NVM such as a NVRAM, a solid state drive (SSD), a SCM, and a new memory.

Figure 29:
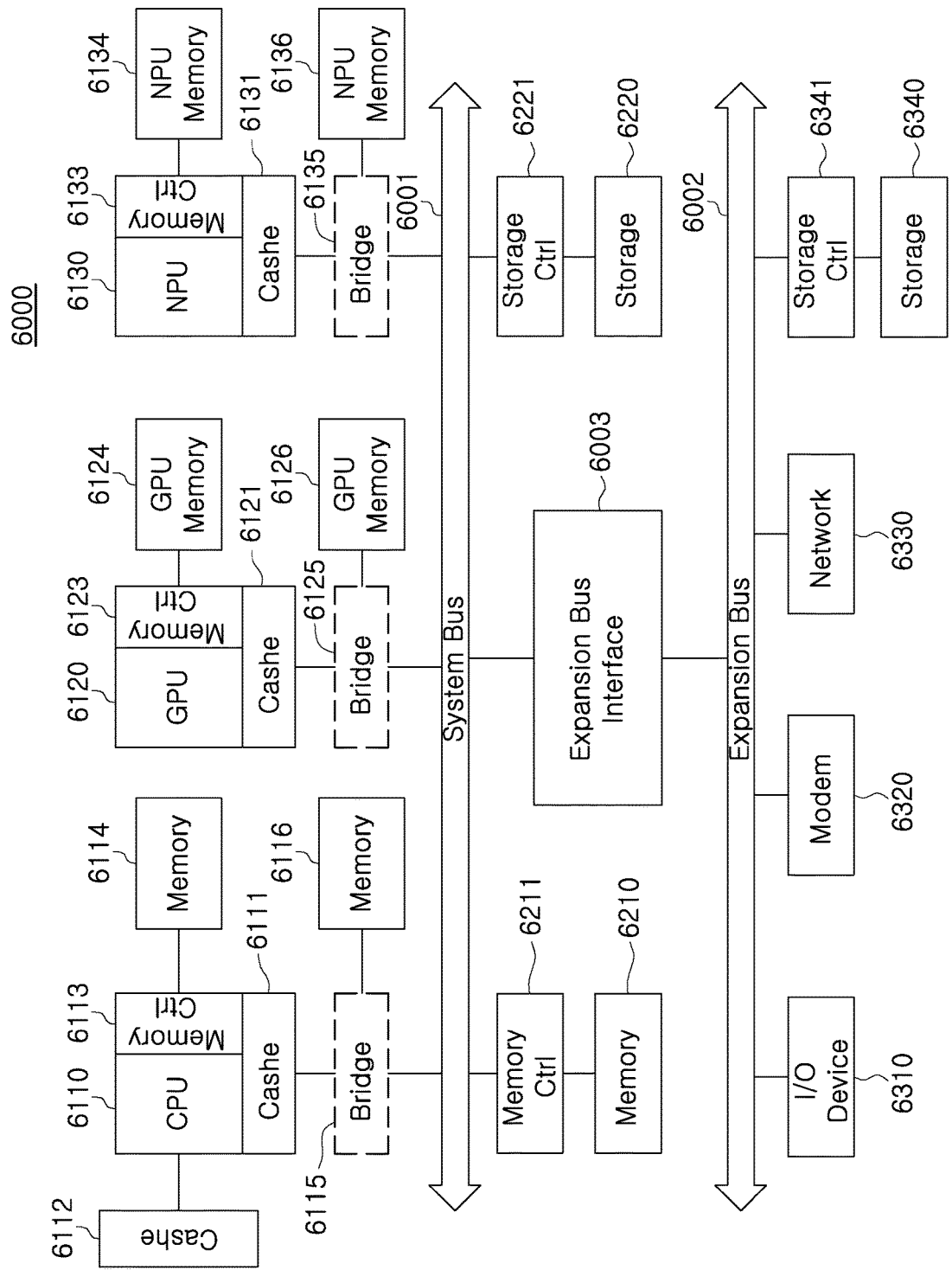
FIG. 29 is a diagram illustrating an example of a computing system 6000 according to another example embodiment of the inventive concept.

FIG. 29 is a diagram illustrating an example of a computing system 6000 according to another example embodiment. Referring to FIG. 29, the computing system 6000 may include a central processing unit (CPU) 6110, a graphic processing unit (GPU) 6120, a neural processing unit (NPU) 6130, or an application-specific processing unit, connected to a system bus 6001, a memory device 6210 or a storage device 6220 connected to the system bus 6001, an I/O device 6310 connected to an expansion bus 6002, a modem 6320, a network device 6330, or a storage device 6340. The expansion bus 6002 may be connected to the system bus 6001 through an expansion bus interface 6003.

Each of the CPU 6110, the GPU 6120, and the NPU 6130 may include on-chip caches 6111, 6121, and 6131, respectively. The off-chip caches 6112, 6122, and 6132 may be connected to the corresponding CPU 6110, the corresponding GPU 6120, and the corresponding NPU 6130, respectively. Each of on-chip/off-chip caches 6111, 6121, 6131, 6112, 6122, and 6132 may include a volatile memory such as a dynamic random access memory (DRAM), a static random access memory (SRAM), or the like, a NVM such as a NAND flash memory, a phase random access memory (PRAM), a resistive random access memory (RRAM), or the like.

The first memories 6114, 6124, and 6134 may be connected to the CPU 6110, the GPU 6120, and the NPU 6130 through corresponding memory controllers 6113, 6123, and 6133.

The second memories 6116, 6126, and 6136 may be connected to the CPU 6110, the GPU 6120, and the NPU 6130 through bridges 6115, 6125, and 6135. The bridges 6115, 6125, and 6135 may include memory controllers for controlling corresponding memories 6116, 6126, and 6136. Each of the bridges 6115, 6125, and 6135 may be implemented as a network device, a wireless network device, a switch, a bus, a cloud, or an optical channel.

In an example embodiment, the memories 6124 and 6126 may include a GPU memory. In an example embodiment, the memories 6124 and 6126 may include an NPU memory. In an example embodiment, one or more of the main memories 6114, 6116, 6124, 6126, 6134, 6136, and 6210 may be implemented to operate using a write operation (e.g., a writing method) like those previously described in relation to the example embodiments of FIGS. 1 to 26. At least one of the main memories 6114, 6116, 6124, 6126, 6134, 6136, and 6210 may include a volatile memory such as a DRAM, an SRAM, or the like, or a NVM such as an NAND flash memory, a PRAM, or the like. The memory 6210 may have a latency and capacity lower than those of a storage 6220.

The CPU 6110, the GPU 6120, or the NPU 6130 may access the secondary storage device 6220 through the system bus 6001.

The memory 6210 may be controlled by the memory controller 6211. The memory controller 6211 may be connected to the system bus 6001. The storage device 6220 may be controlled by the storage controller 6221. The storage controller 6221 may be connected to the system bus 6001.

The storage device 6220 may be configured to store data. The storage controller 6221 may be configured to read out data from the storage device 6220 and to transmit the read-out data to a host. The storage controller 6221 may be configured to store transmitted data in the storage device 6220 in response to a request from the host. Each of the storage device 6220 and the storage controller 6221 may store metadata, may read a cache to store frequently accessing data, or may include a buffer for storing a cache for improving efficiency in writing. For example, a write cache may receive a certain number of requests for writing and may process the requests. The storage device 6220 may include a volatile memory such as a hard disk drive (HDD), and may include a NVM such as a NVRAM, a solid state drive (SSD), a SCM, a new memory.

Figure 30:
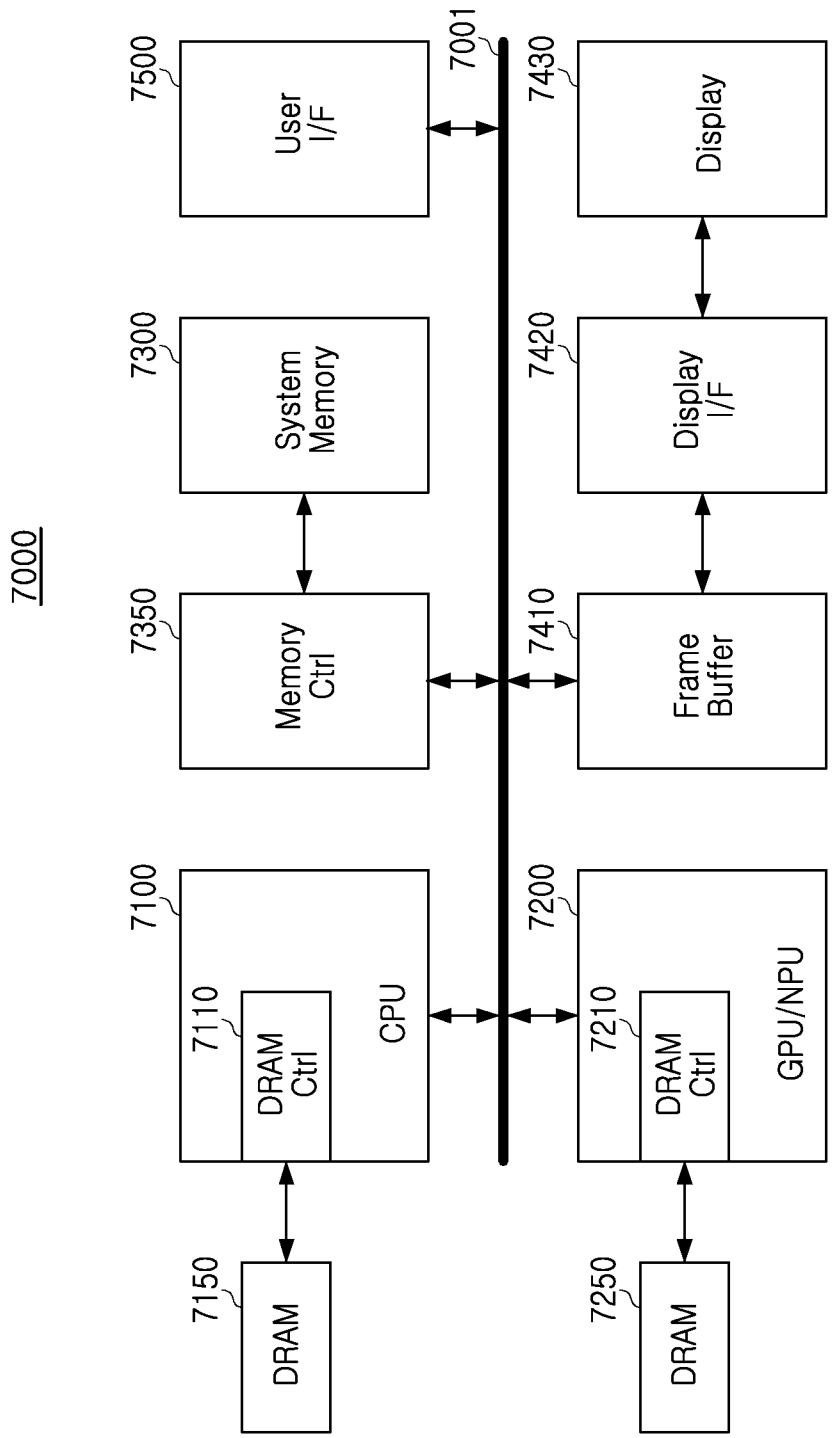
FIG. 30 is a diagram illustrating an example of a computing system 7000 according to another example embodiment of the inventive concept.

FIG. 30 is a diagram illustrating an example of a computing system 7000 according to another example embodiment. Referring to FIG. 30, the computing system 7000 may include a CPU 7100 connected to a system bus 7001, a GPU/NPU 7200, a frame buffer 7410, a memory controller 7350, and a user interface 7500.

The CPU 7100 may include a DRAM controller 7110. The DRAM controller 7110 may control a DRAM 7150. The GPU/NPU 7200 may include a DRAM controller 7210. The DRAM controller 7210 may control a DRAM 7250.

The frame buffer 7410 may store at least one frame data for outputting identical image data, still image data, for a certain period of time through a panel self-refresh (PSR) in a display device 7430 according to control of the GPU/NPU 7200. In an example embodiment, the frame buffer 7410 may include a volatile memory such as a dynamic random access memory (DRAM), a static random access memory (SRAM), or the like, a NVM such as a NAND flash memory, a phase random access memory (PRAM), a resistive random access memory (RRAM), or the like.

A system memory 7300 may operate according to control of the memory controller 7350. The system memory 7300 may include a NVM device which may be configured to perform a write operation like those described above in relation to the example embodiments of FIGS. 1 to 26. The memory controller 7350 may receive a request for writing from the CPU 7100 or the GPU/NPU 7200. The system memory 7300 may perform a pre-read operation according to a write command from the memory controller 7350, may compare read data obtained as a result of the pre-read operation with write data, and may determine whether to perform an overwrite operation according to the comparison result. Accordingly, a write operation for applying a write pulse according to the read data and the write data may be performed, or a write operation may be completed without applying a write pulse.

According to the aforementioned example embodiments, certain NVM device(s), and writing methods (or performance of write operations) performed by the NVM device(s) may be used in various storage devices such that both data reliability and power consumption are improved.

While the example embodiments have been shown and described above, it will be apparent to those skilled in the art that modifications and variations could be made without departing from the scope of the inventive concept as defined by the appended claims.

What is claimed is:

1. A non-volatile memory (NVM) device comprising:
a memory cell array including a plurality of resistive memory cells connected to a plurality of bit lines and a plurality of word lines;
a word line driver configured to select one of the plurality of word lines in response to an address and apply a word line voltage to the selected word line;
a bit line driver configured to select one of the plurality of bit lines in response to the address and apply a bit line voltage to the selected bit line;
a write circuit configured to generate the bit line voltage and the word line voltage in response to a write control signal;
a read circuit configured to read data from a resistive memory cell connected to the selected word line and the selected bit line in response to a read control signal;
an input and output (I/O) circuit configured to receive write data from an external device; and
control logic configured to:
select a write mode from a plurality of write modes,
generate the write control signal based on at least one of the selected write mode, the write data, and the read data, and
generate the read control signal based on at least one of the selected write mode and the write data, wherein:
at least one of the plurality of write modes defines a write operation that performs a read operation,
the bit line voltage having a second read level is applied to the selected bit line when the read operation is performed, and
the second read level is higher than a first read level for another read operation performed in a read mode that is not associated with any of the plurality of write modes.

2. The NVM device of claim 1, wherein the memory cell array includes a plurality of memory cell layers vertically stacked in a direction perpendicular to a substrate.

3. The NVM device of claim 2, wherein at least one of the plurality of write modes is selected according to a position of at least one memory cell layer among the plurality of memory cell layers.

4. The NVM device of claim 1, wherein at least one of the plurality of write modes is selected according to the address.

5. The NVM device of claim 1, wherein the control logic includes a write latch configured to store the write data and a read latch configured to store the read data.

6. The NVM device of claim 1, wherein the plurality of write modes include a normal mode, a data comparison write (DCW) mode, an aggressive data comparison write (aDCW) mode, and a read skip aggressive data comparison write (RDSKIP aDCW) mode.

7. The NVM device of claim 6, wherein the DCW mode does not perform a write operation when the write data and the read data are same.

8. The NVM device of claim 6, wherein the aDCW mode does not perform a write operation when both the write data and the read data are reset data.

9. The NVM device of claim 6, wherein the RDSKIP aDCW mode does not perform:
a write operation when both the write data and the read data are reset data, and
a sensing operation when the write data is set data.

10. The NVM device of claim 6, wherein the control logic includes an event activating signal generator including:
a first logic circuit configured to perform an XOR operation on the write data and the read data;
a second logic circuit configured to perform an AND operation on an output of the first logic circuit and a DCW mode activating signal;
a third logic circuit configured to perform an AND operation on the read data and an aDCW mode activating signal;
a fourth logic circuit configured to perform a NOR operation on the DCW mode activating signal, the aDCW mode activating signal, and an RDSKIP aDCW mode activating signal; and
a fifth logic circuit configured to generate an event activating signal by performing an OR operation on an output of the second logic circuit, an output of the third logic circuit, and an output of the fourth logic circuit.

11. The NVM device of claim 10, wherein the control logic further includes a write control signal generator including:
a sixth logic circuit configured to perform an AND operation on the event activating signal and a write activating signal;
a seventh logic circuit configured to invert the write data;
an eighth logic circuit configured to generate a set activation signal by performing an AND operation on the write data and an output of the sixth logic circuit; and
a ninth logic circuit configured to generate a reset activation signal by performing an AND operation on the output of the sixth logic circuit and an output of the eighth logic circuit.

12. The NVM device of claim 11, wherein the control logic further includes a read control signal generator including a tenth logic circuit configured to generate a read skip activating signal by performing an AND operation on the RDSKIP aDCW mode activating signal and the write data.

13. The NVM device of claim 1, wherein:
the control logic is further configured to control performance of a read operation during which a read voltage is applied to the selected bit line, and
the read circuit includes a sense amplifier configured to compare a voltage of the selected word line with a reference voltage.

14. A non-volatile memory (NVM) device comprising:
a memory cell array including:
a plurality of resistive memory cells connected to a plurality of bit lines and a plurality of word lines, and
a plurality of memory cell layers vertically stacked in a direction perpendicular to a substrate;
a word line driver that selects one of the plurality of word lines as a selected word line in response to an address and applies a word line voltage to the selected word line;
a bit line driver that selects one of the plurality of bit lines as a selected bit line in response to the address and applies a bit line voltage to the selected bit line;
a write circuit that generates the bit line voltage and the word line voltage in response to a write control signal;
a read circuit that reads read data from a resistive memory cell connected to the selected word line and the selected bit line in response to a read control signal;
an input and output (I/O) circuit that receives write data from an external device; and control logic that:
   selects a selected write mode from a plurality of write modes according to a distance of a memory cell layer, among the plurality of memory cell layers, from the substrate,
   generates the write control signal based on the selected write mode, the write data, or the read data, and
   generates the read control signal based on the selected write mode or the write data.

15. The NVM device of claim 14, wherein the selected write mode is a read skip aggressive data comparison write mode that does not perform:
   a write operation when both the write data and the read data are reset data, and
   a sensing operation when the write data is set data.

16. A non-volatile memory (NVM) device comprising:
   a memory cell array including a plurality of resistive memory cells connected to a plurality of bit lines and a plurality of word lines;
   a word line driver that selects one of the plurality of word lines as a selected word line in response to an address and applies a word line voltage to the selected word line;
   a bit line driver that selects one of the plurality of bit lines as a selected bit line in response to the address and applies a bit line voltage to the selected bit line;
   a write circuit that generates the bit line voltage and the word line voltage in response to a write control signal;
   a read circuit that reads read data from a resistive memory cell connected to the selected word line and the selected bit line in response to a read control signal;
   an input and output (I/O) circuit that receives write data from an external device; and
   control logic that:
      selects a read skip aggressive data comparison write (RDSKIP aDCW) mode that does not perform:
         a write operation when both the write data and the read data are reset data; and
         a sensing operation when the write data is set data, and generates the write control signal based on the RDSKIP aDCW mode, the write data, or the read data.

17. The NVM device of claim 16, wherein the control logic generates the read control signal based on the RDSKIP aDCW mode or the write data.

18. The NVM device of claim 17, wherein the RDSKIP aDCW mode is selected according to the address.

19. The NVM device of claim 17, wherein:
   the memory cell array includes a plurality of memory cell layers vertically stacked in a direction perpendicular to a substrate, and
   the RDSKIP aDCW mode is selected according to a position of a memory cell layer among the plurality of memory cell layers.

20. The NVM device of claim 17, wherein:
   the RDSKIP aDCW mode defines a write operation that performs a read operation,
   the bit line voltage has a second read level that is applied to the selected bit line when the read operation is performed, and
   the second read level is higher than a first read level for a read operation performed in a normal mode.

* * * * *